United States Patent
Huang et al.

(10) Patent No.: US 12,328,917 B2
(45) Date of Patent: Jun. 10, 2025

(54) SEMICONDUCTOR STRUCTURE HAVING SECOND CONTACT STRUCTURE OVER SECOND SIDE OF FIRST S/D STRUCTURE

(71) Applicant: Taiwan Semiconductor Manufacturing Company, Ltd., Hsinchu (TW)

(72) Inventors: Lin-Yu Huang, Hsinchu (TW); Li-Zhen Yu, New Taipei (TW); Huan-Chieh Su, Tianzhong Township, Changhua County (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 437 days.

(21) Appl. No.: 17/824,329

(22) Filed: May 25, 2022

(65) Prior Publication Data

US 2023/0387200 A1 Nov. 30, 2023

(51) Int. Cl.
| | | |
|---|---|---|
| *H10D 62/10* | (2025.01) | |
| *H10D 30/01* | (2025.01) | |
| *H10D 30/67* | (2025.01) | |
| *H10D 84/01* | (2025.01) | |
| *H10D 84/03* | (2025.01) | |

(52) U.S. Cl.
CPC ......... *H10D 62/118* (2025.01); *H10D 30/031* (2025.01); *H10D 30/6713* (2025.01); *H10D 30/6735* (2025.01); *H10D 30/6757* (2025.01); *H10D 84/0128* (2025.01); *H10D 84/013* (2025.01); *H10D 84/0158* (2025.01); *H10D 84/038* (2025.01)

(58) Field of Classification Search
CPC ........... H01L 29/0665; H01L 29/42392; H01L 29/66742; H01L 29/78618; H01L 29/78696; H10D 62/118; H10D 30/031; H10D 30/6713; H10D 30/6735; H10D 30/6757

See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

*Primary Examiner* — Michael Jung
(74) *Attorney, Agent, or Firm* — Birch, Stewart, Kolasch & Birch, LLP

(57) ABSTRACT

Semiconductor structures and methods for manufacturing the same are provided. The semiconductor structure includes first nanostructures surrounded by a first gate structure, and a first source/drain (S/D) structure adjacent to the first gate structure. The semiconductor structure includes a first contact structure formed over a first side of the first S/D structure, and a second contact structure formed over a second side of the first S/D structure. The second contact structure includes a first portion and a second portion. The first portion and the second portion are made of different materials. The first S/D structure has a first width. The second portion has a second width. The first width is smaller than the second width.

20 Claims, 30 Drawing Sheets

(56) References Cited

U.S. PATENT DOCUMENTS

| | | | |
|---|---|---|---|
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2020/0357930 A1* | 11/2020 | Glass | H01L 29/775 |
| 2021/0119031 A1* | 4/2021 | Song | H01L 27/0924 |
| 2021/0265348 A1* | 8/2021 | Xie | H01L 21/76897 |
| 2022/0199797 A1* | 6/2022 | Naskar | H01L 29/0847 |

* cited by examiner

SEMICONDUCTOR STRUCTURE HAVING SECOND CONTACT STRUCTURE OVER SECOND SIDE OF FIRST S/D STRUCTURE

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
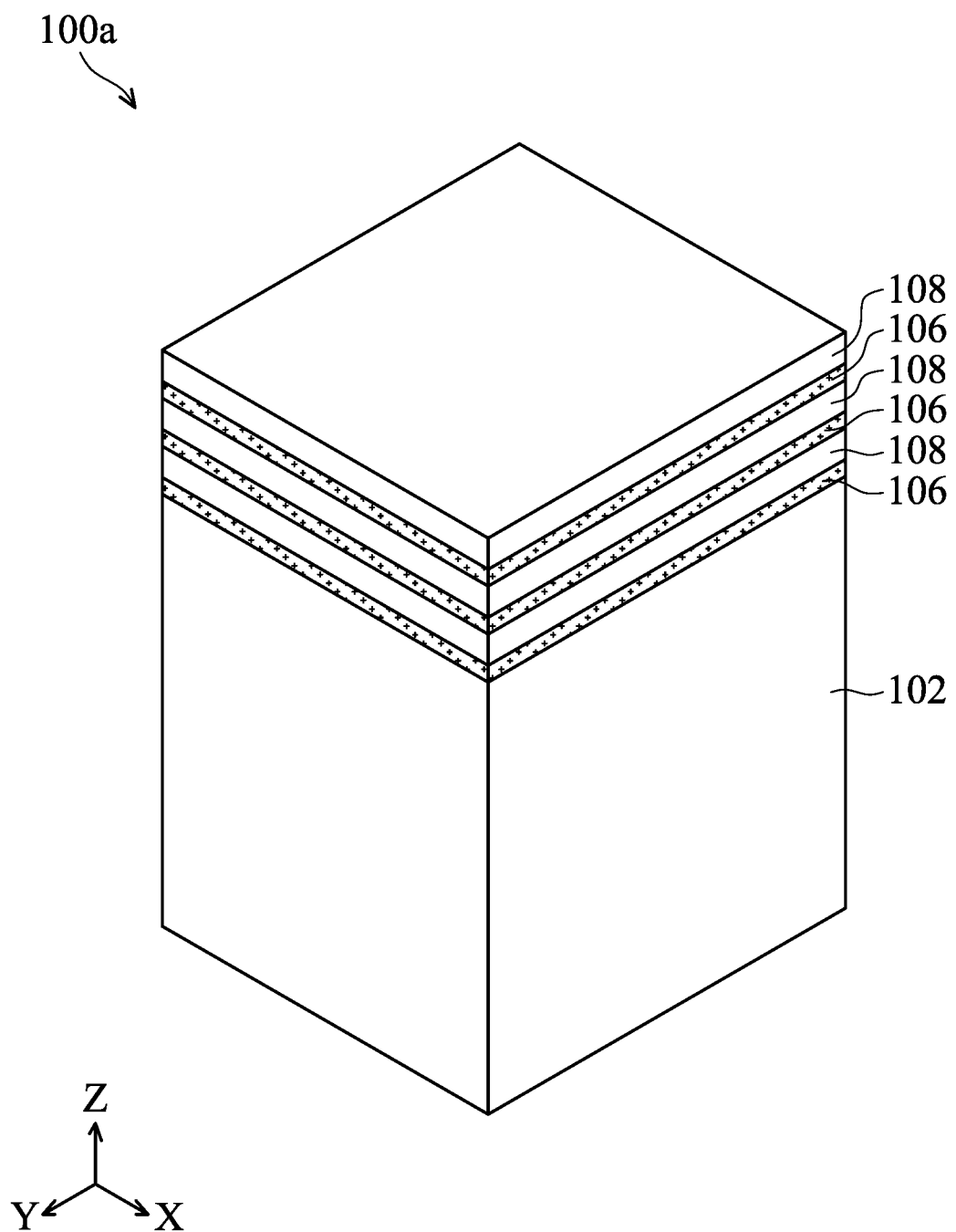
FIGS. 1A to 1Z illustrate diagrammatic perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of semiconductor structures and methods for forming the same are provided. The semiconductor structures may include first nanostructures formed over a substrate and a gate structure wraps around the first nanostructures. A source/drain (S/D) structure is formed attached to the first nanostructures. A front side S/D contact structure and a back side S/D contact structure are formed on opposite sides of the S/D structure. The back side S/D contact structure includes a bottom portion and a top portion. The bottom portion and the top portion are made of different materials. A conductive layer is formed on the back side S/D contact structure. Since bottom portion and the top portion are made of different materials, the diffusion of the bottom portion into the conductive layer is prevented, and the voids are reduce due to forming process of forming the two conductive layers. Accordingly, the reality of the semiconductor structure 100a is improved.

Figure 1B:
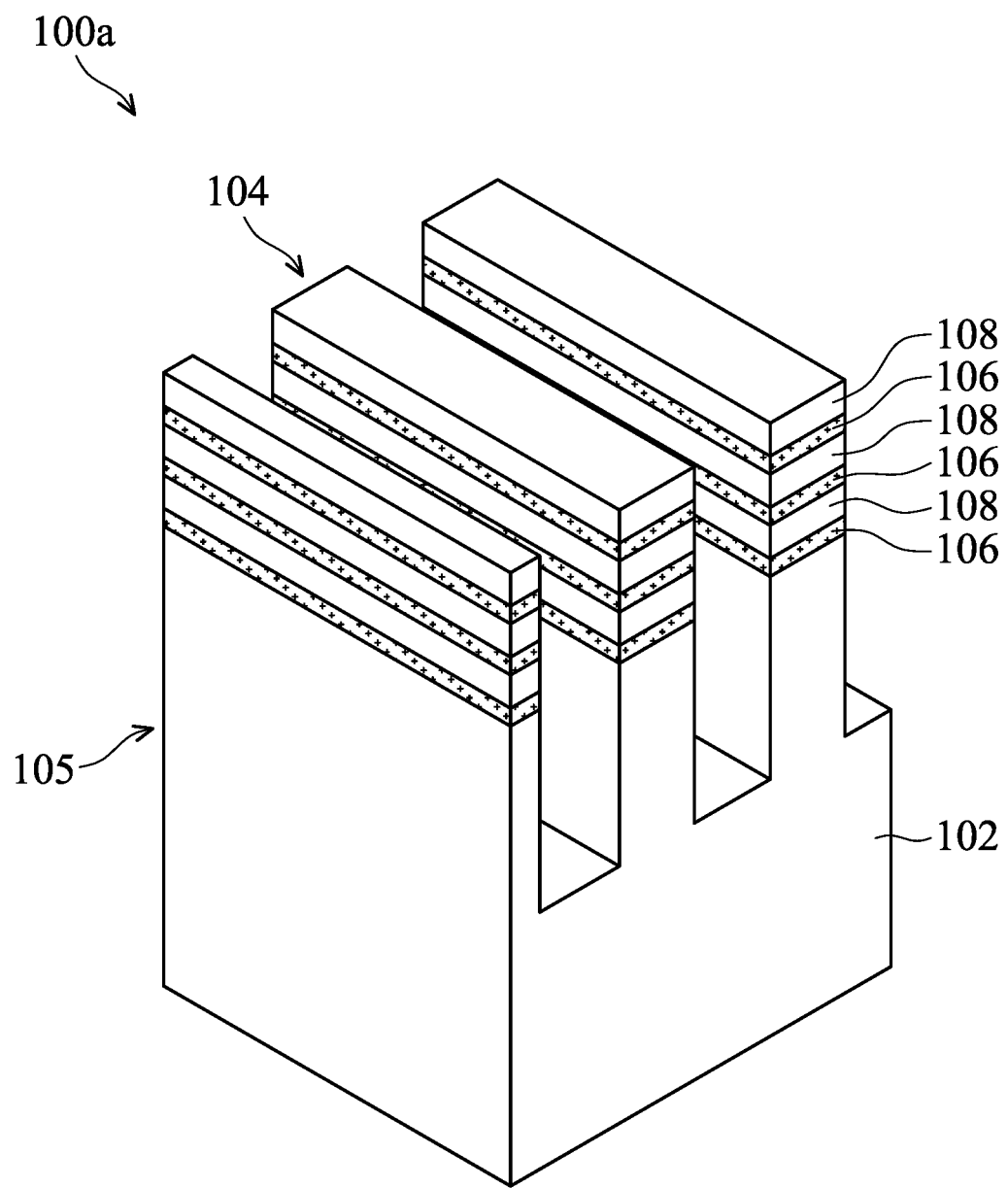
Figure 1C:
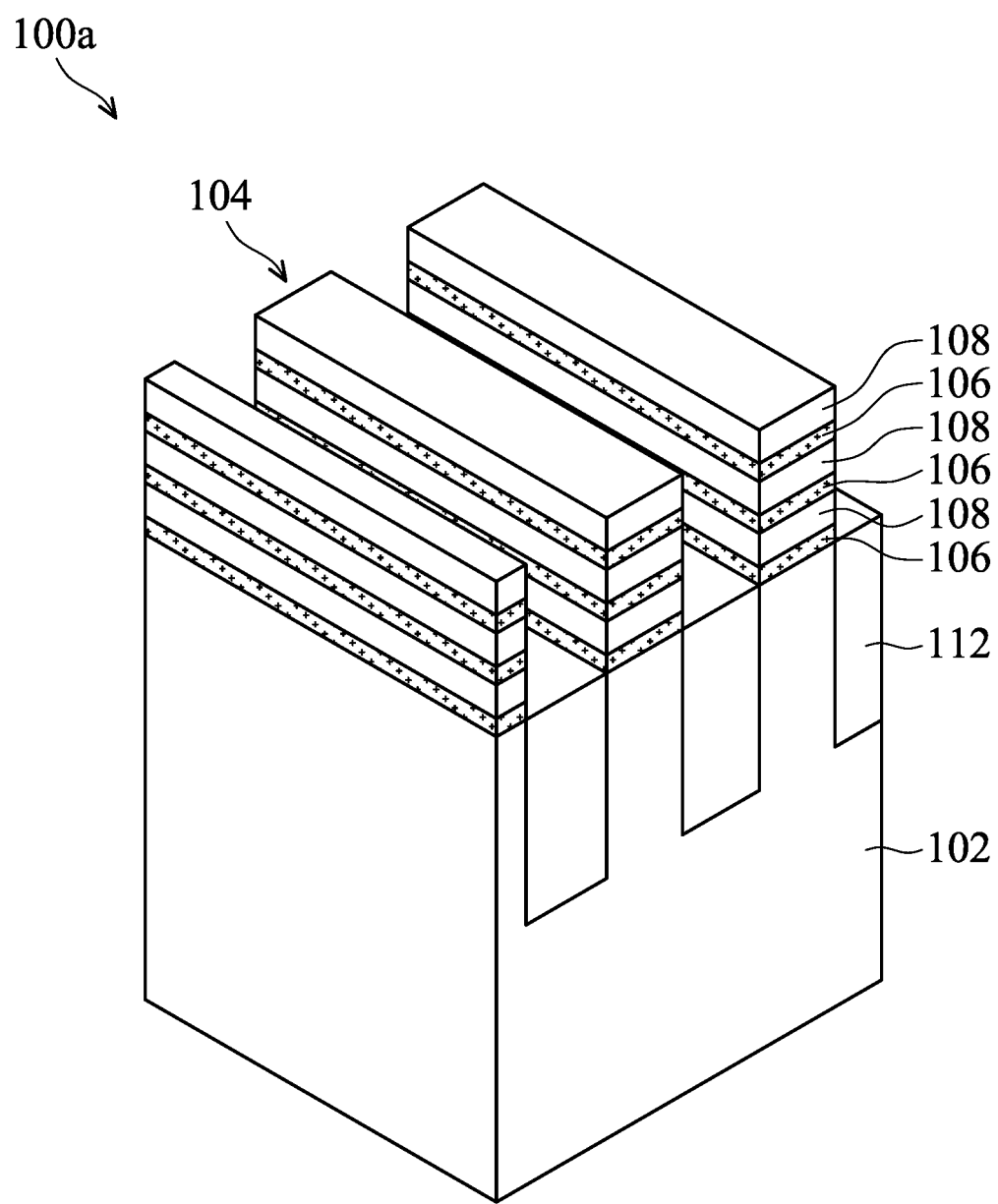
Figure 1D:
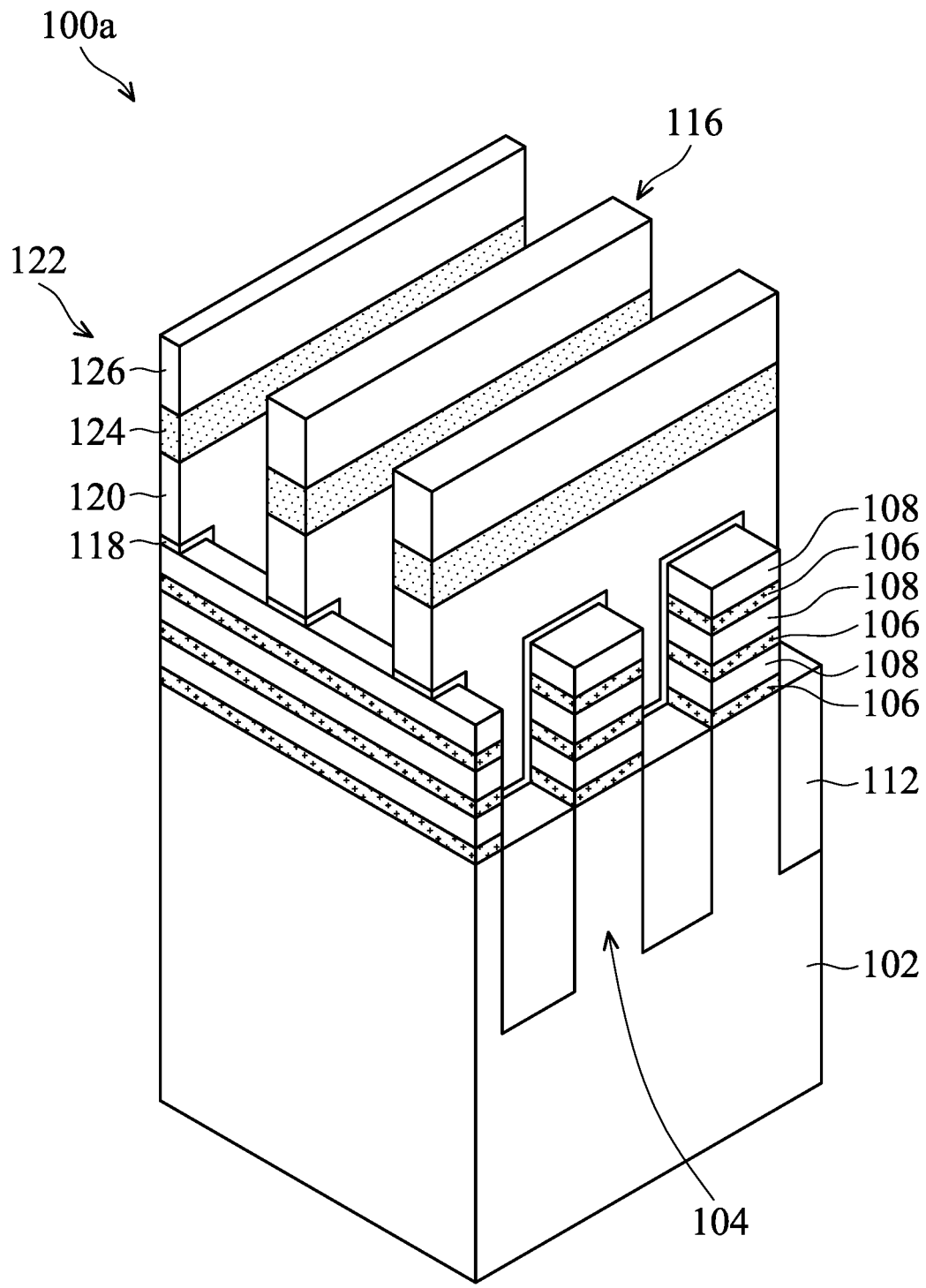
Figure 1E:
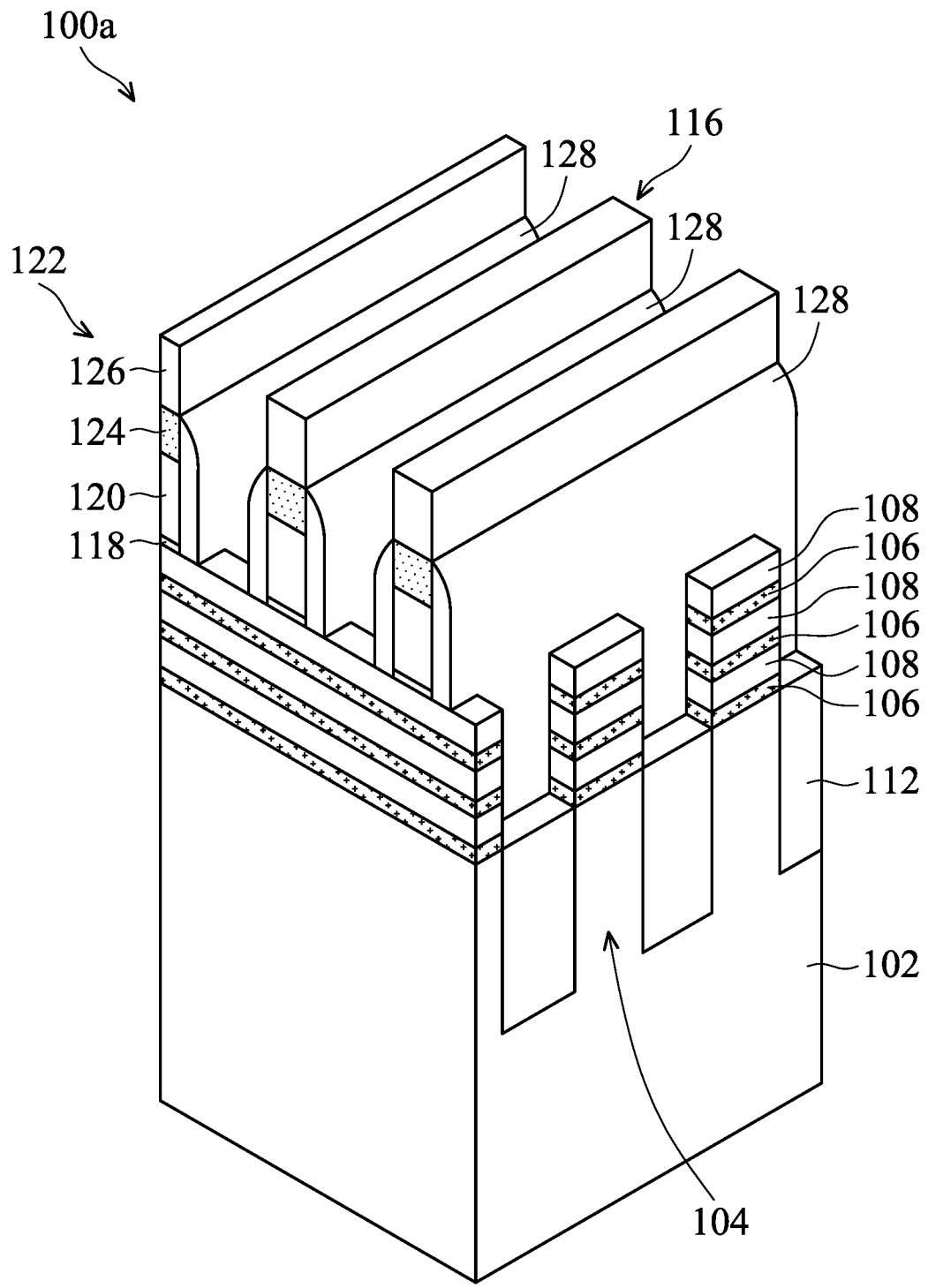
Figure 1F:
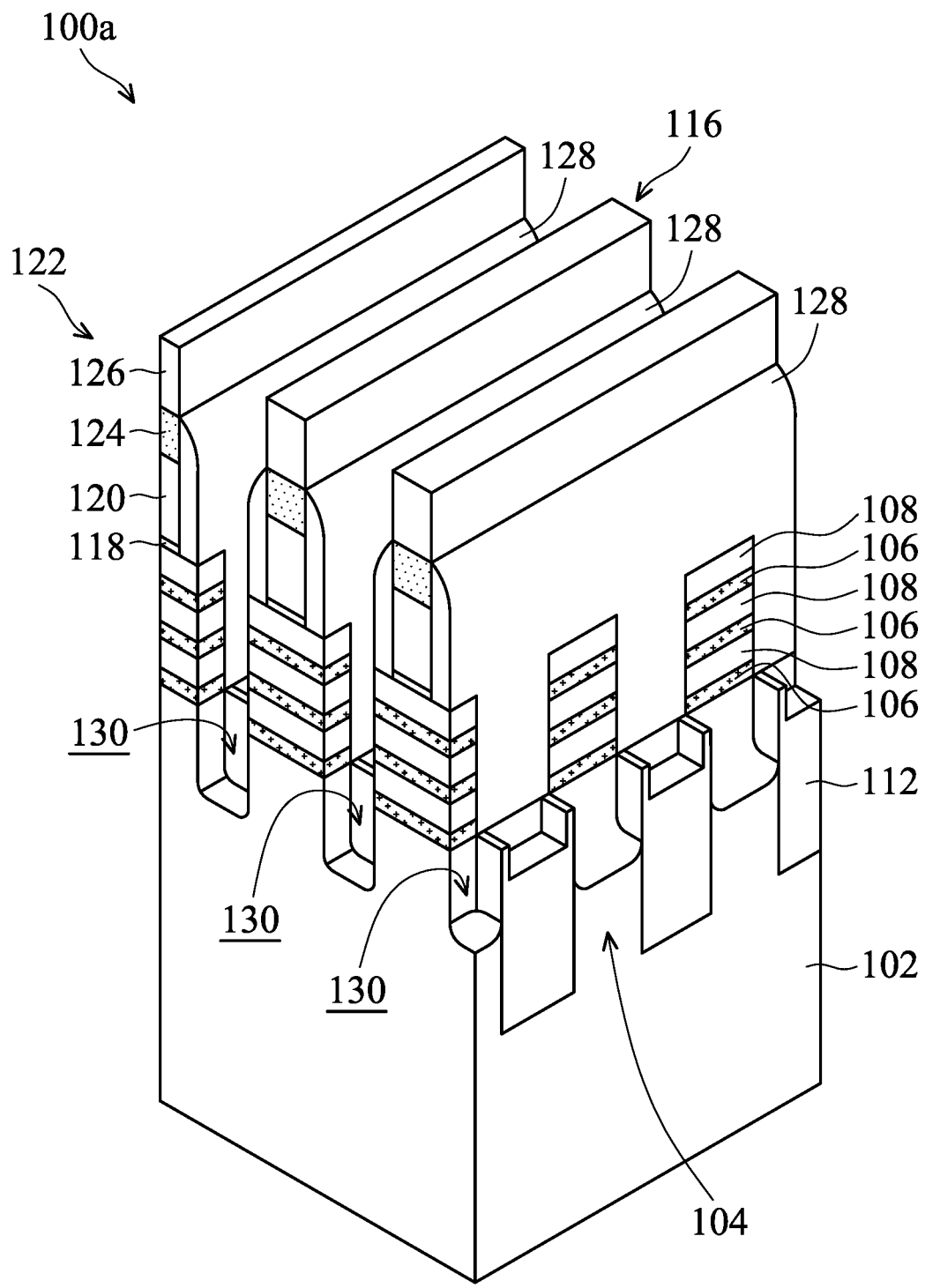
Figure 1G:
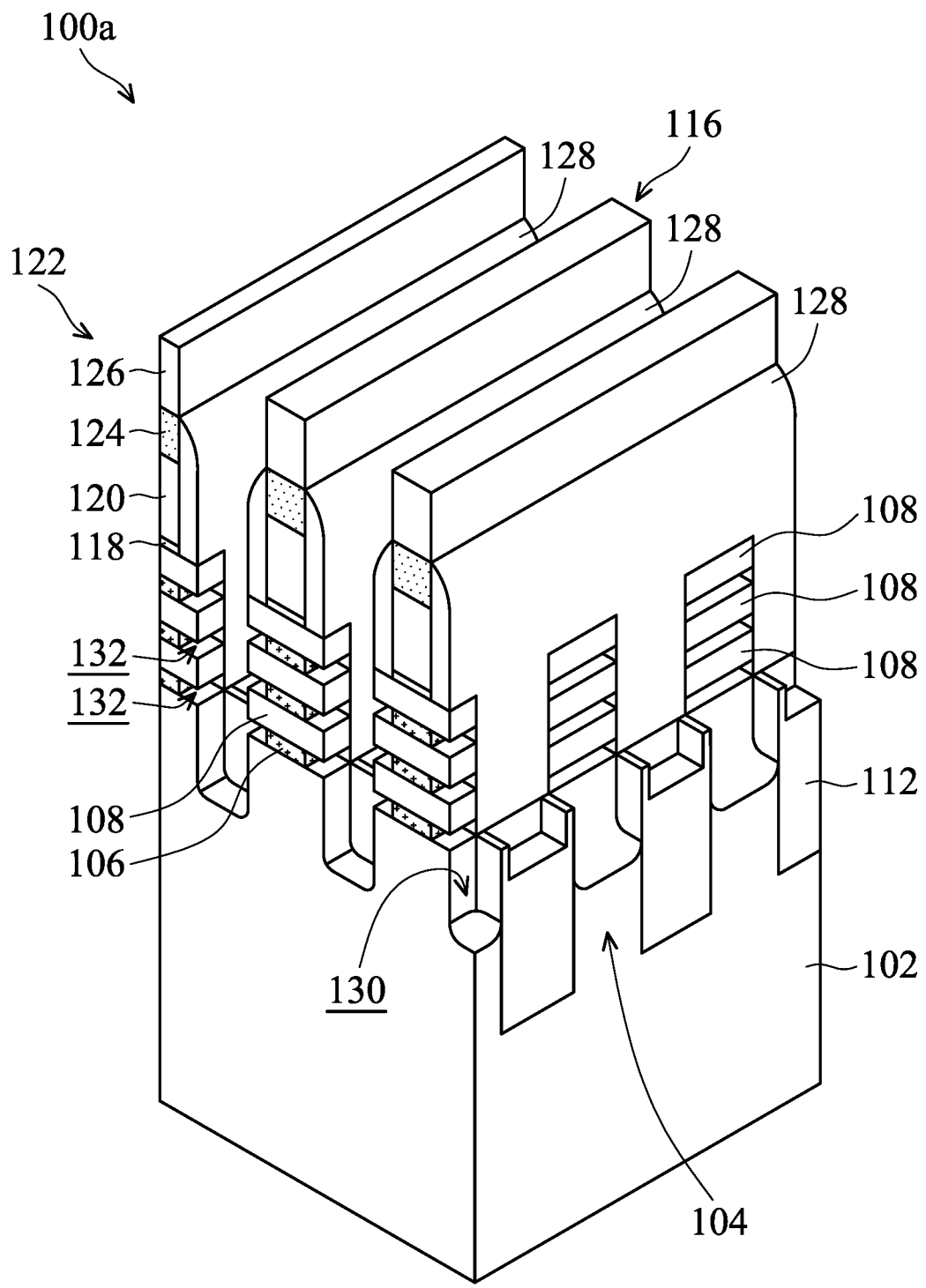
Figure 1H:
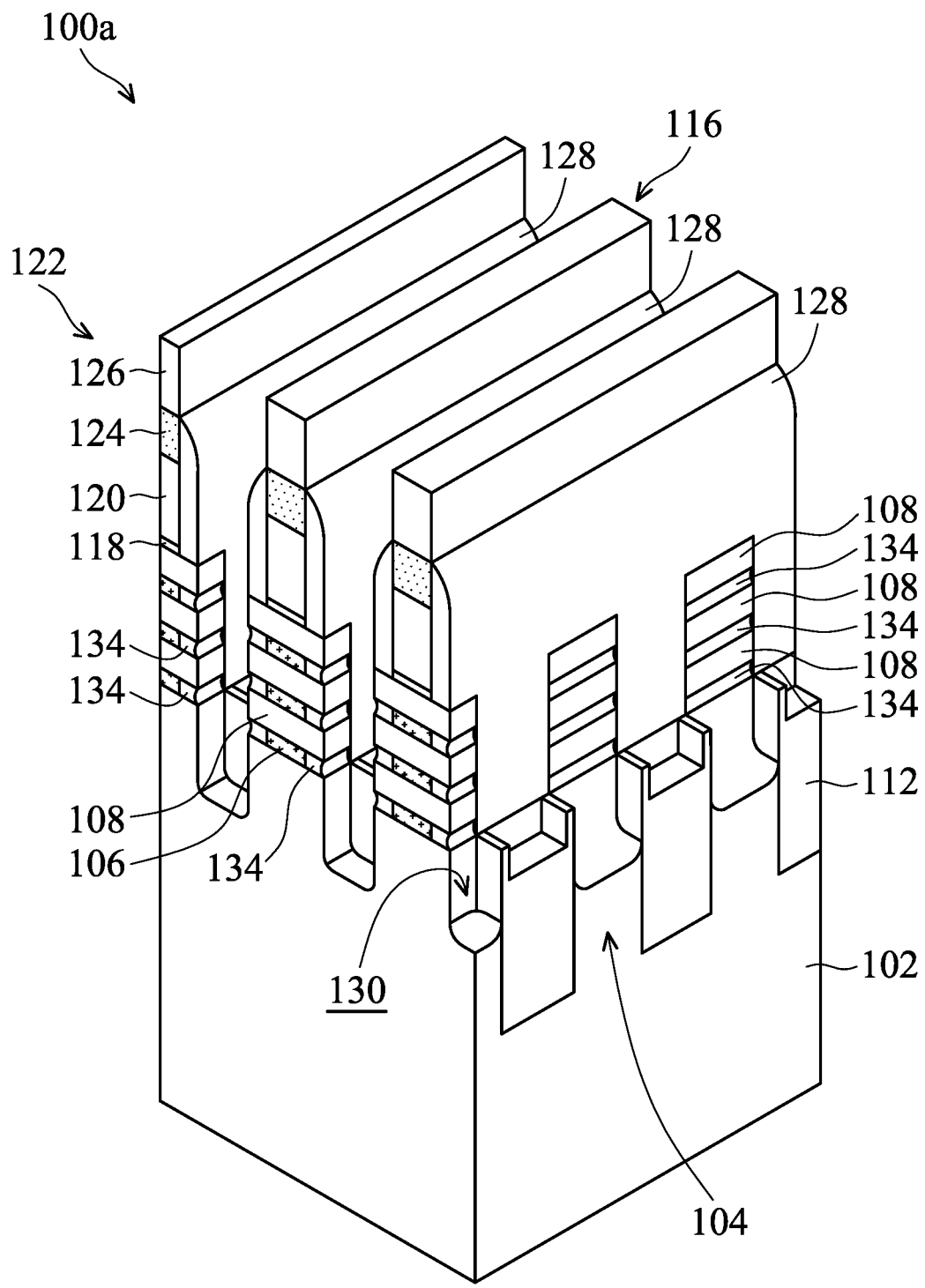
Figure 1I:
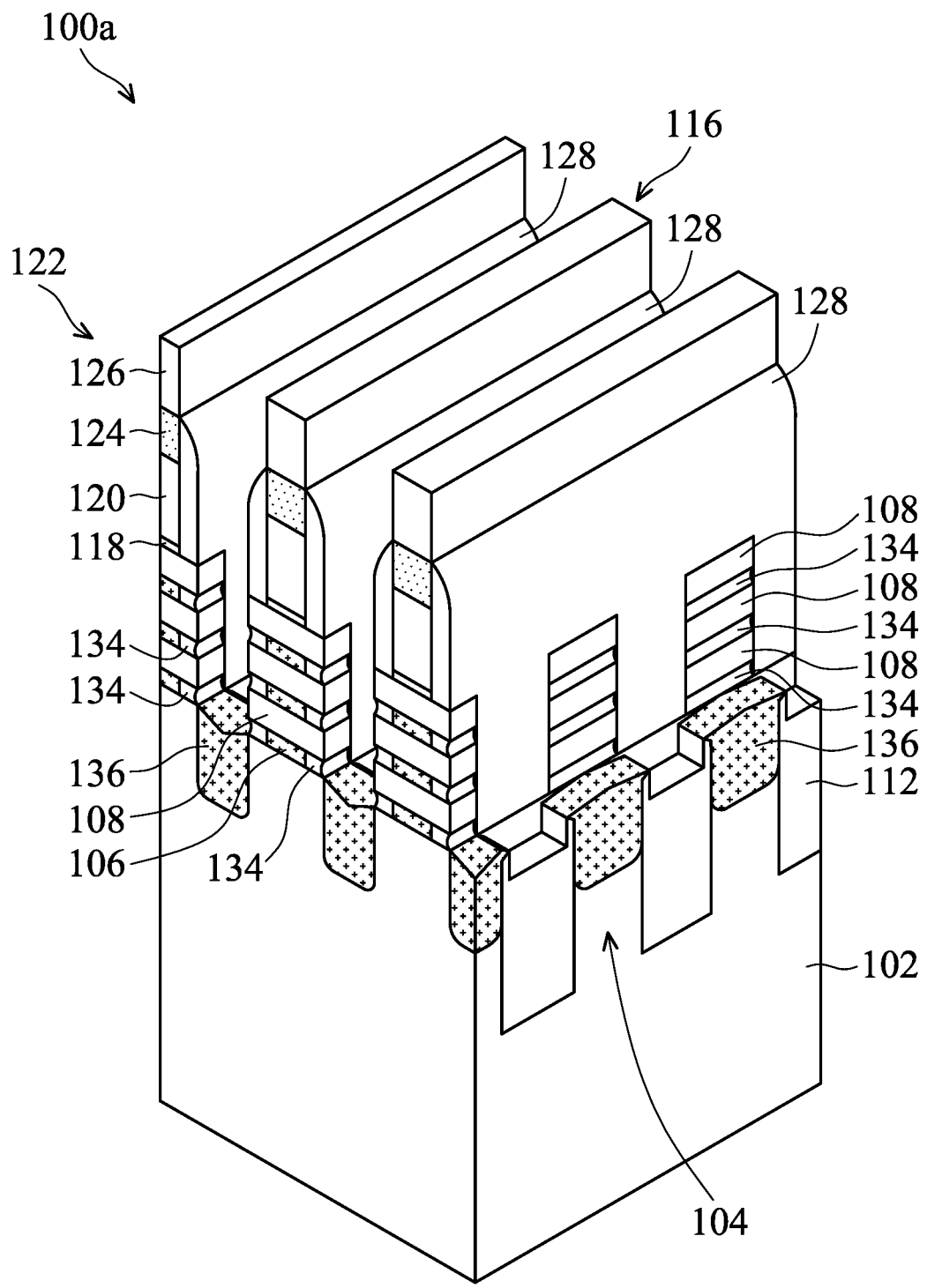
Figure 1J:
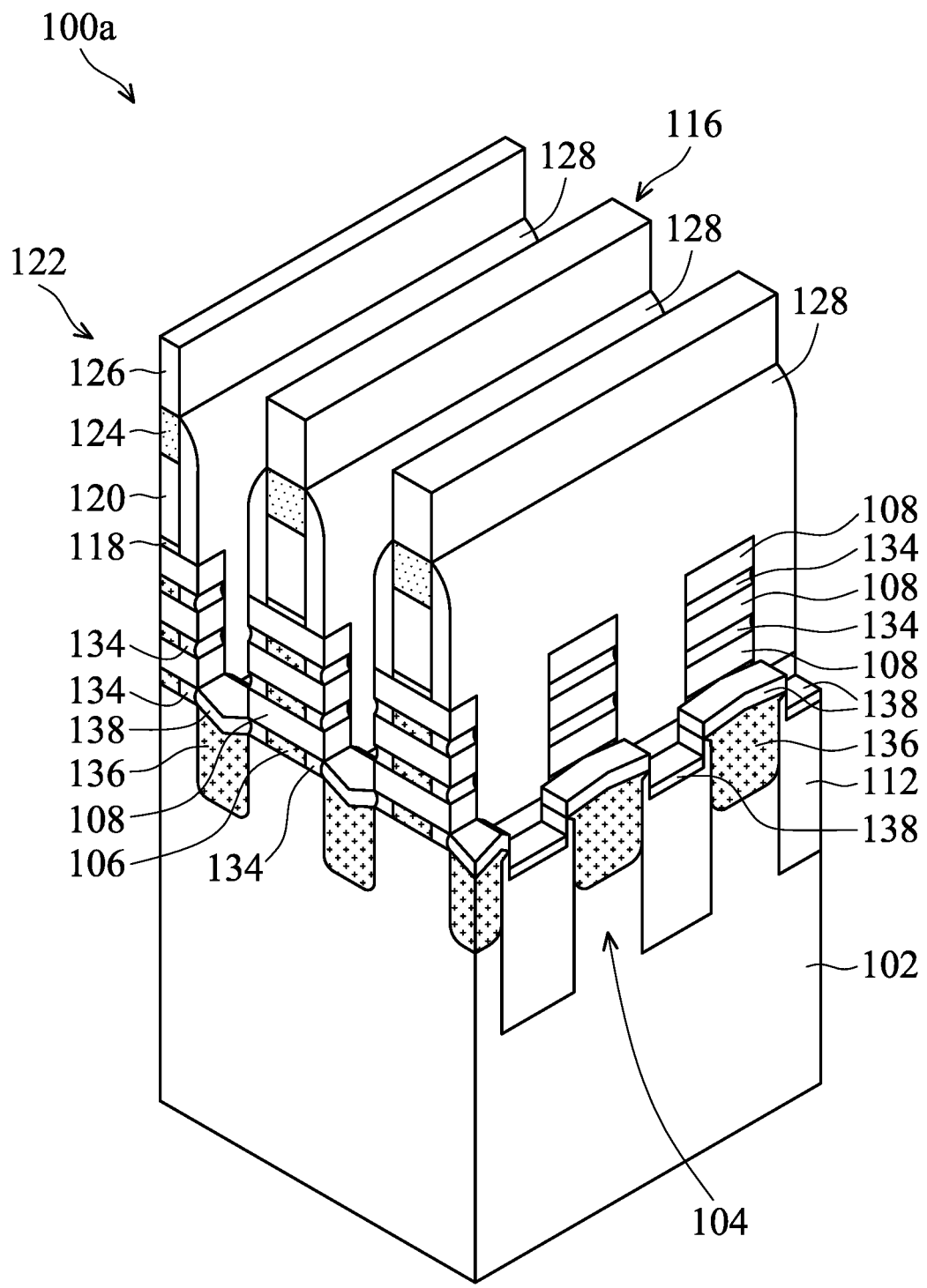
Figure 1K:
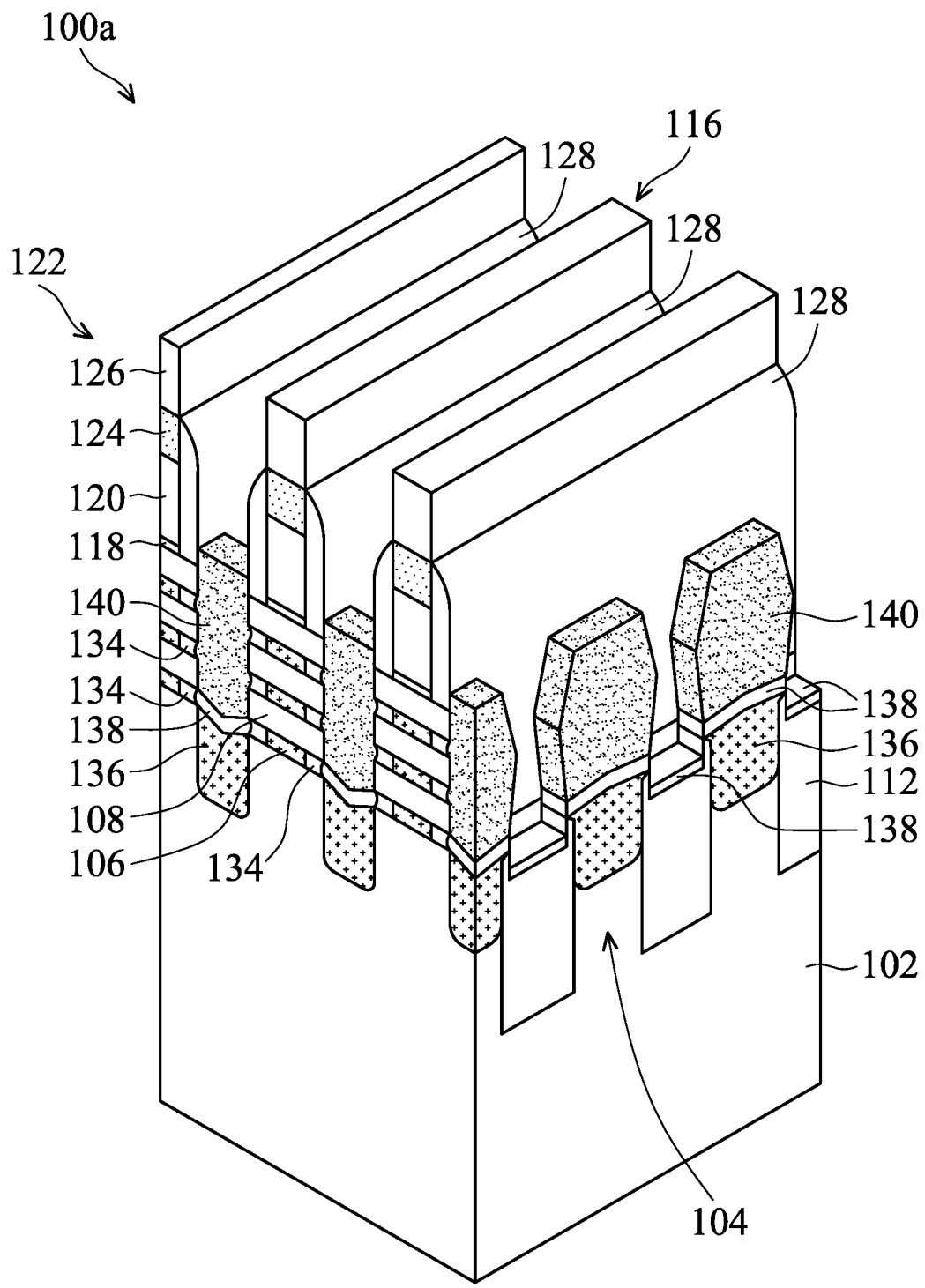
Figure 1L:
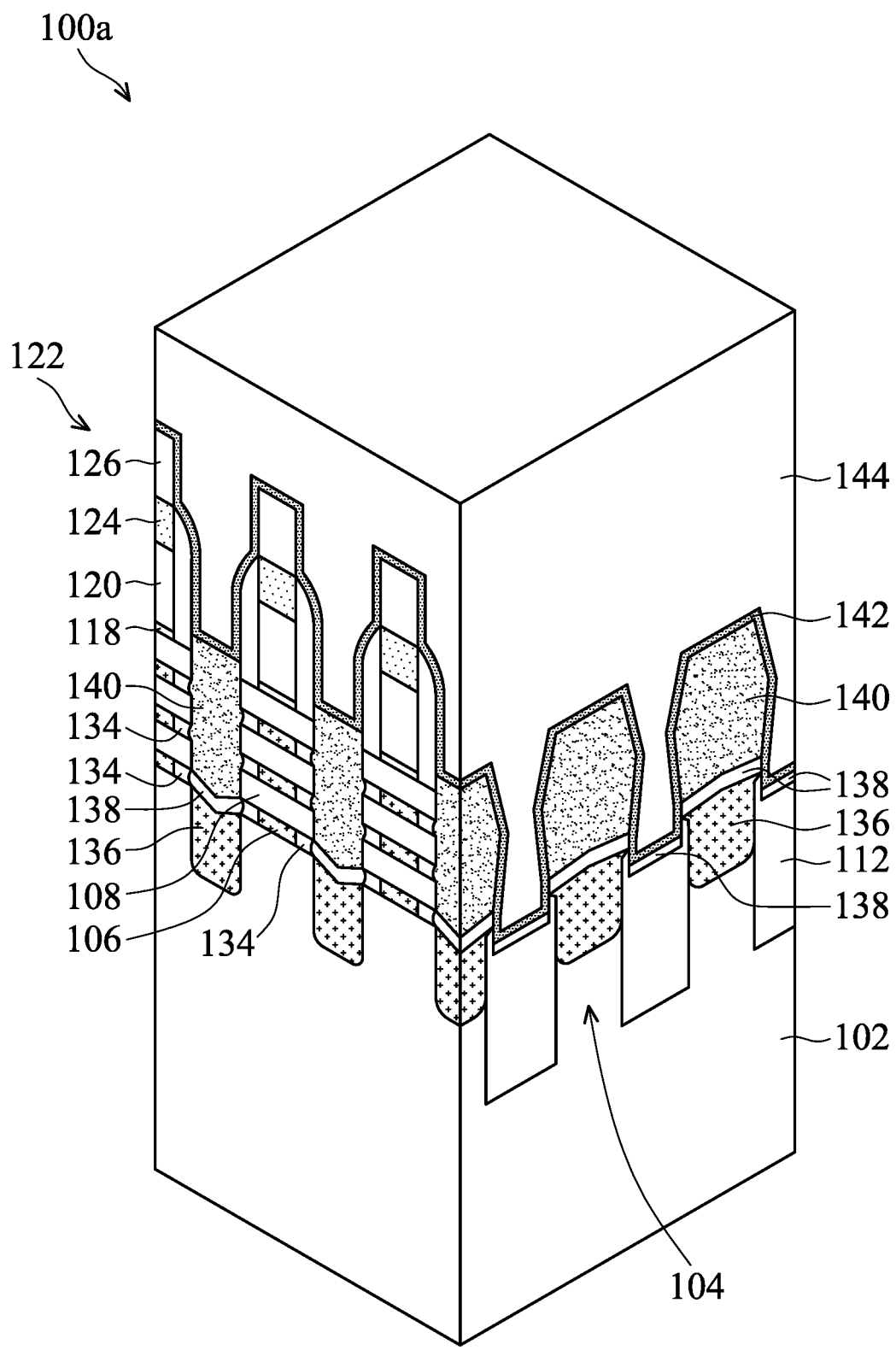
Figure 1M:
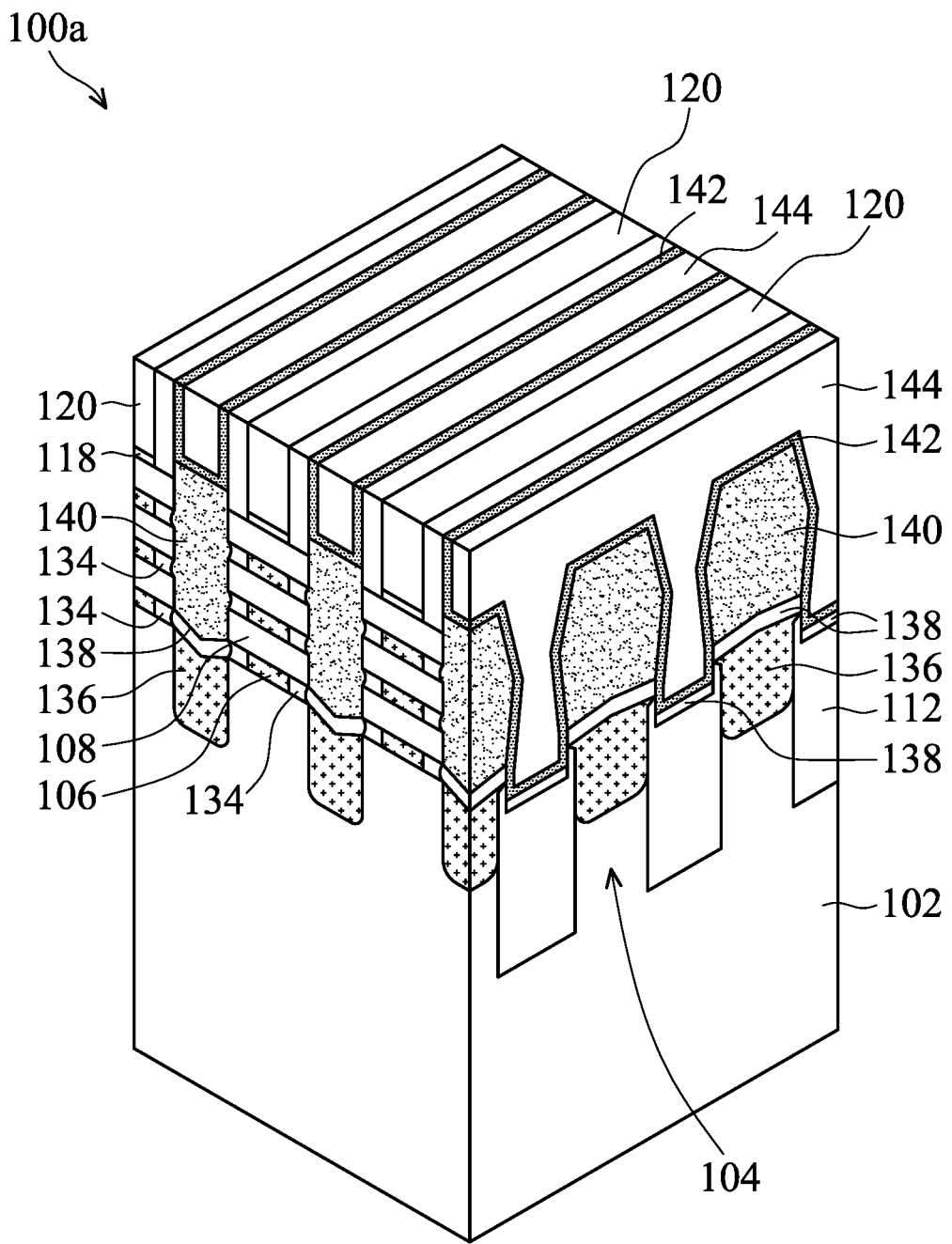
Figure 1N:
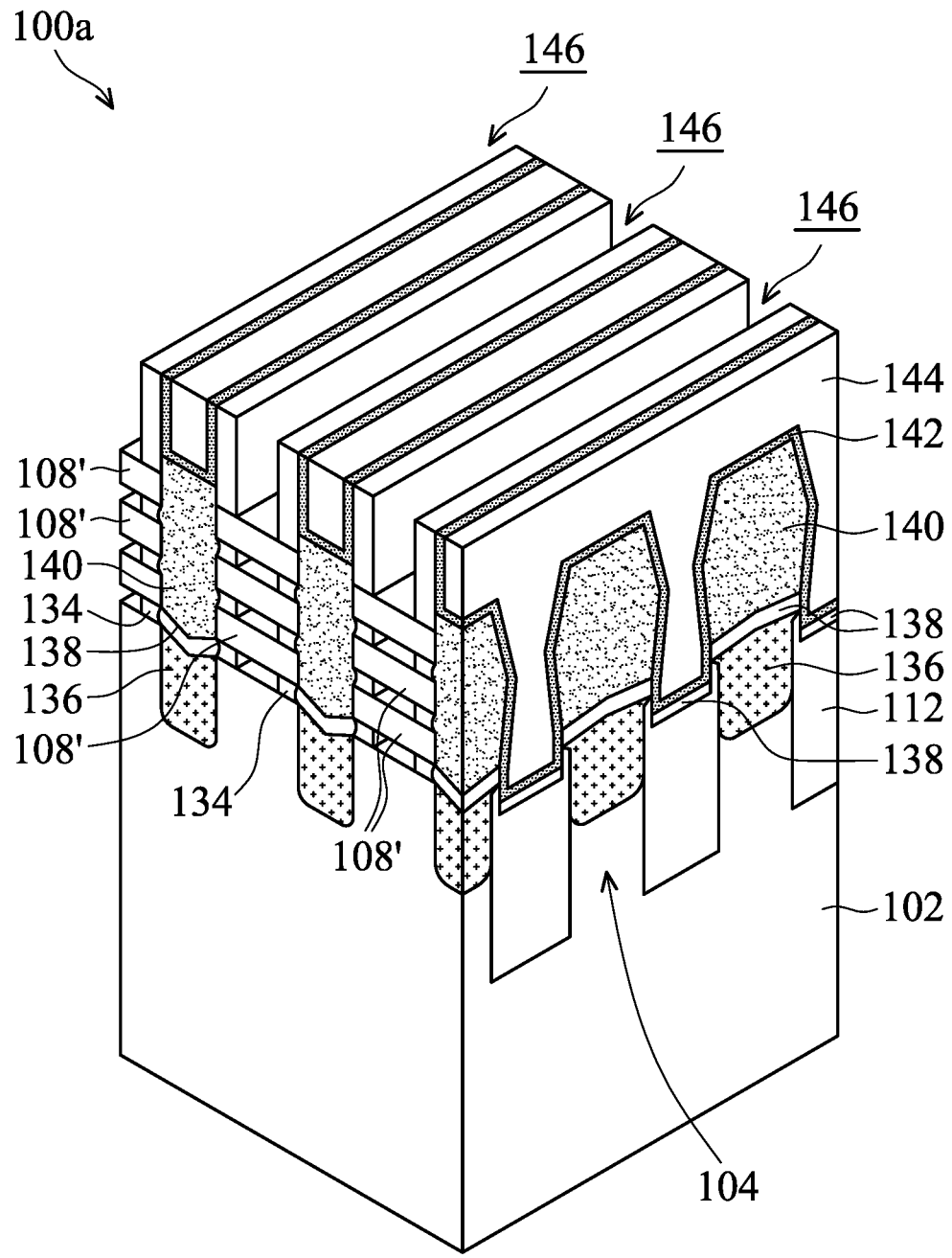
Figure 1O:
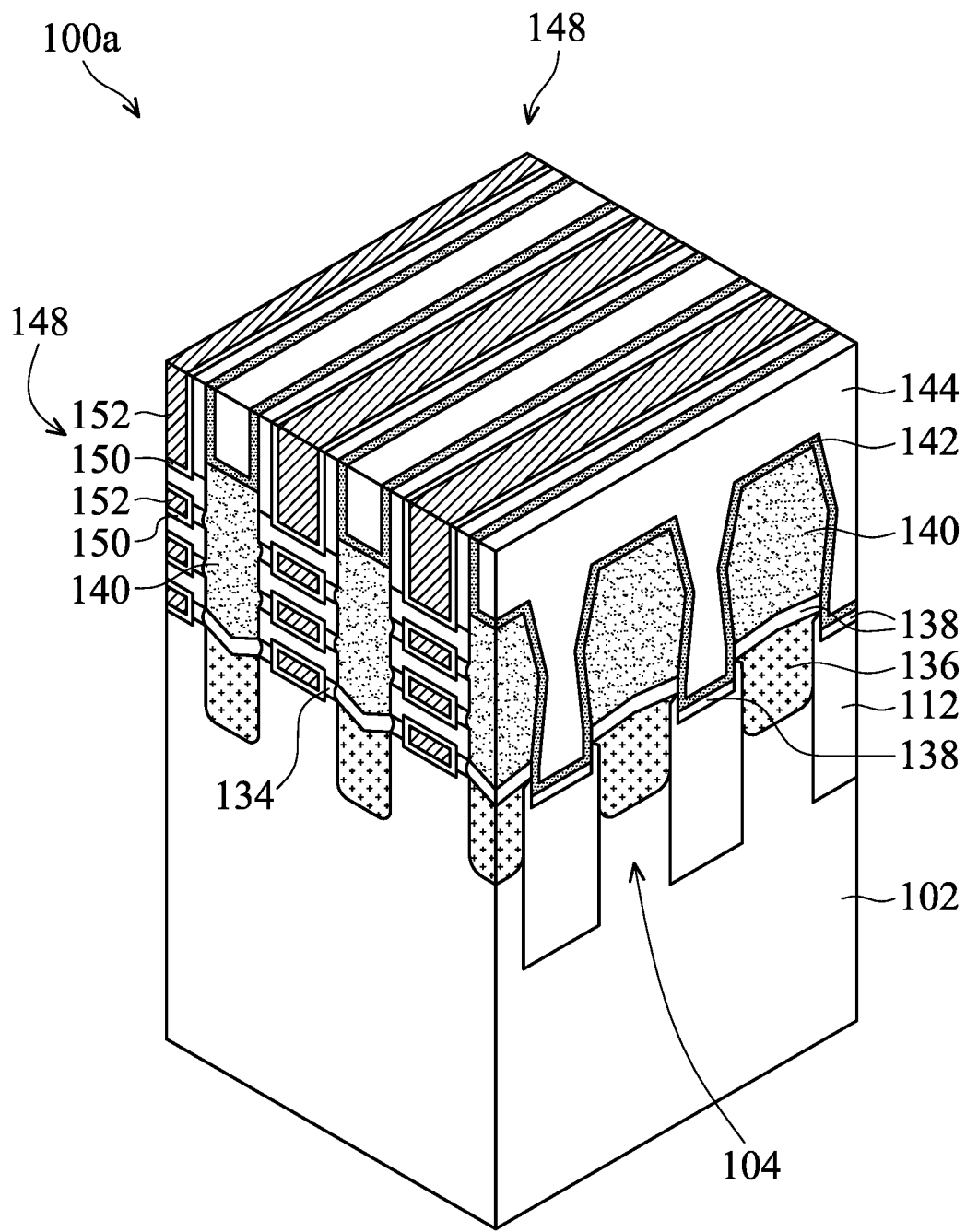
Figure 1P:
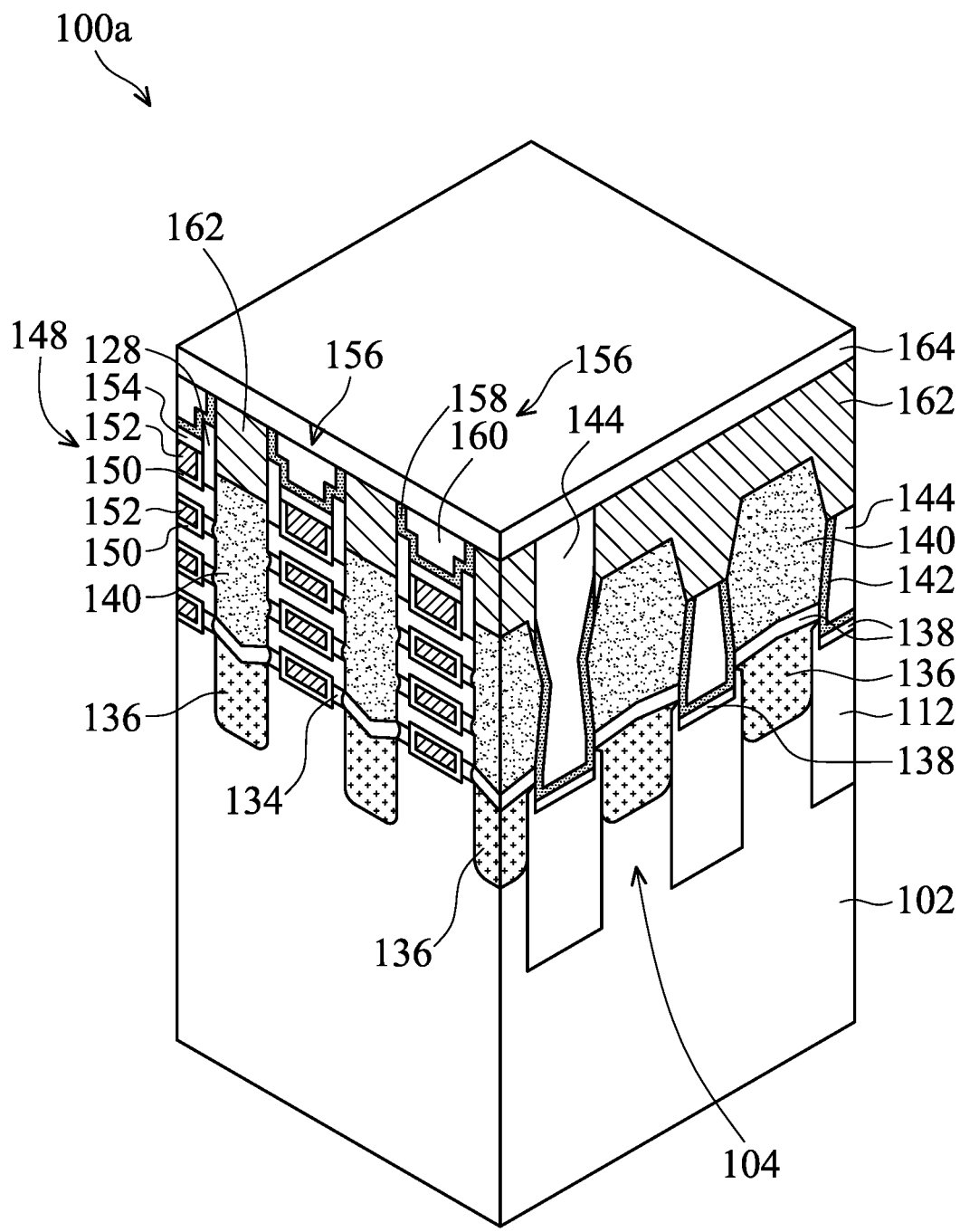
Figure 1Q:
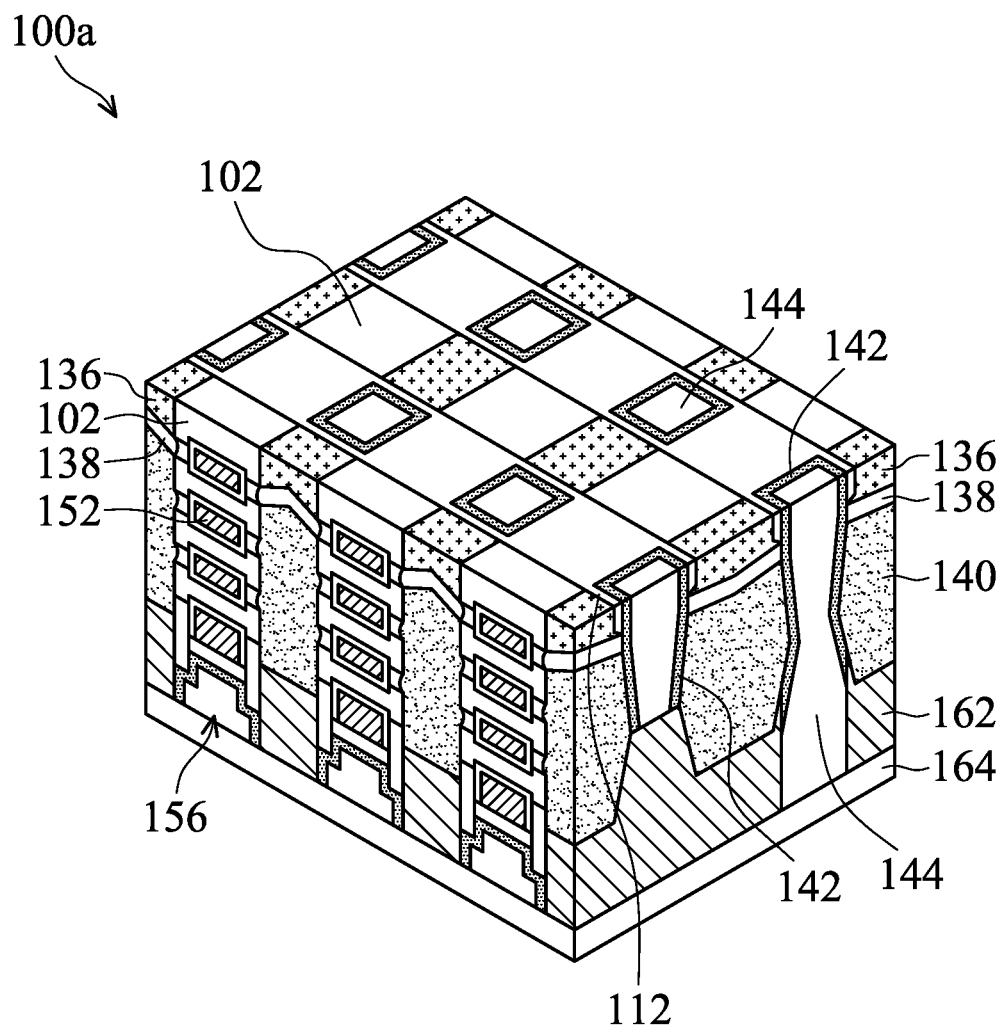
Figure 1R:
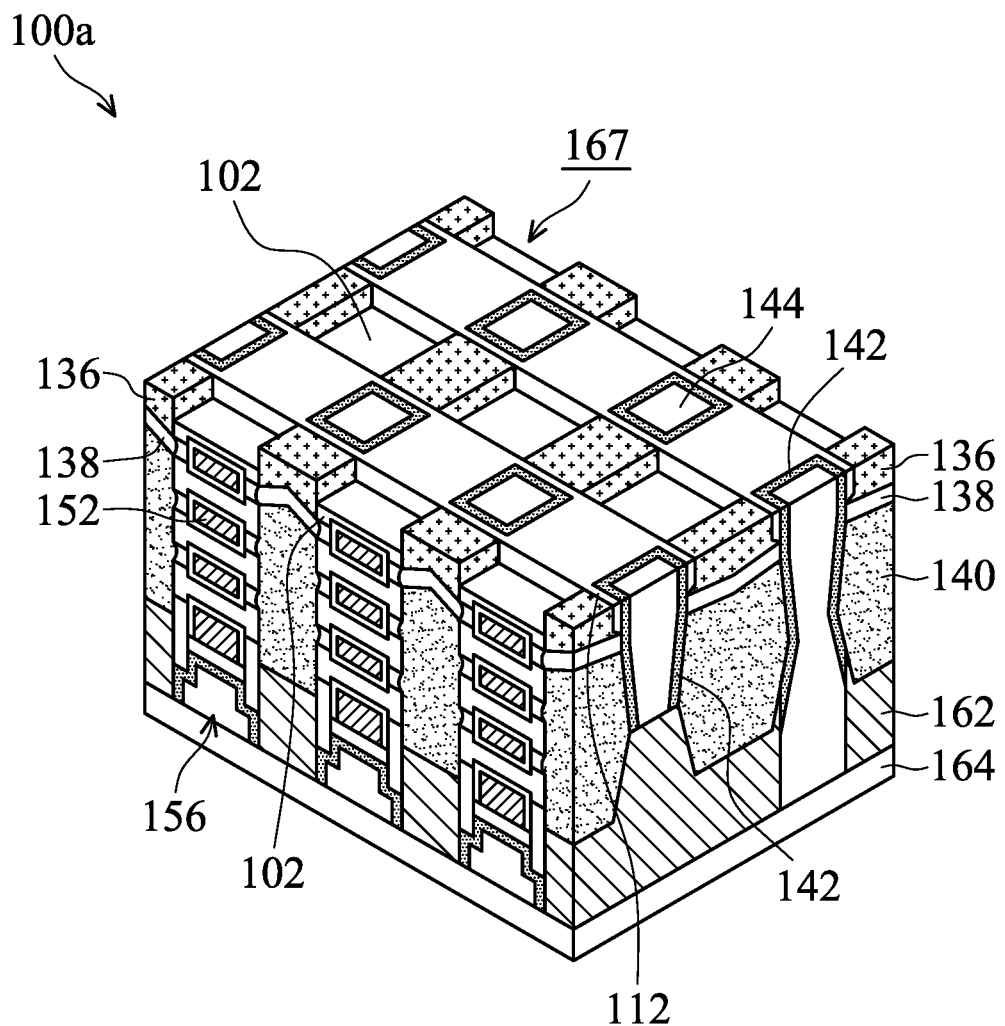
Figure 1S:
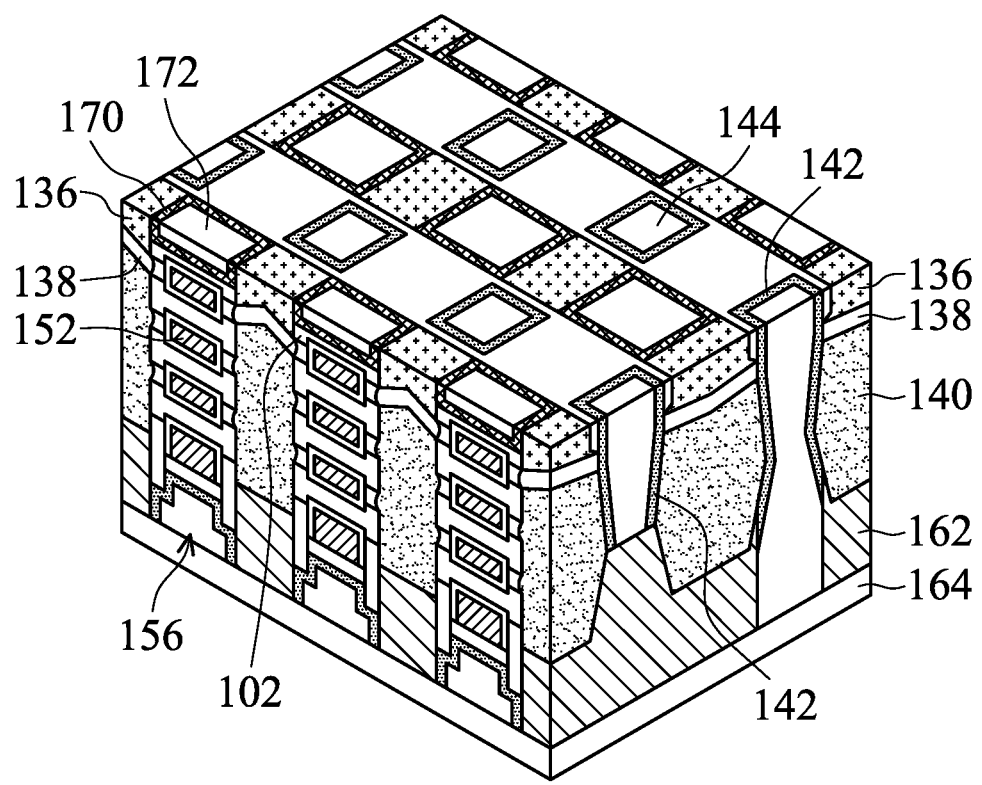
Figure 1T:
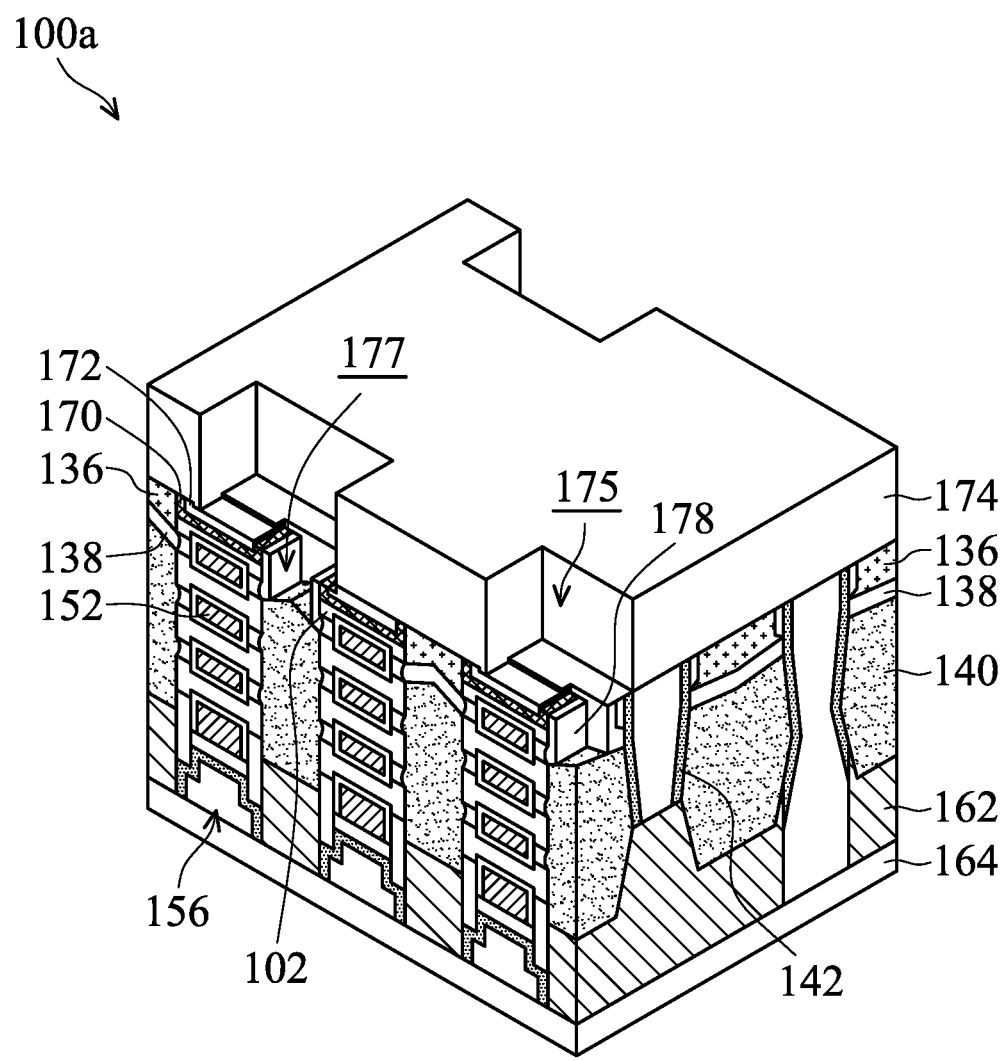
Figure 1U:
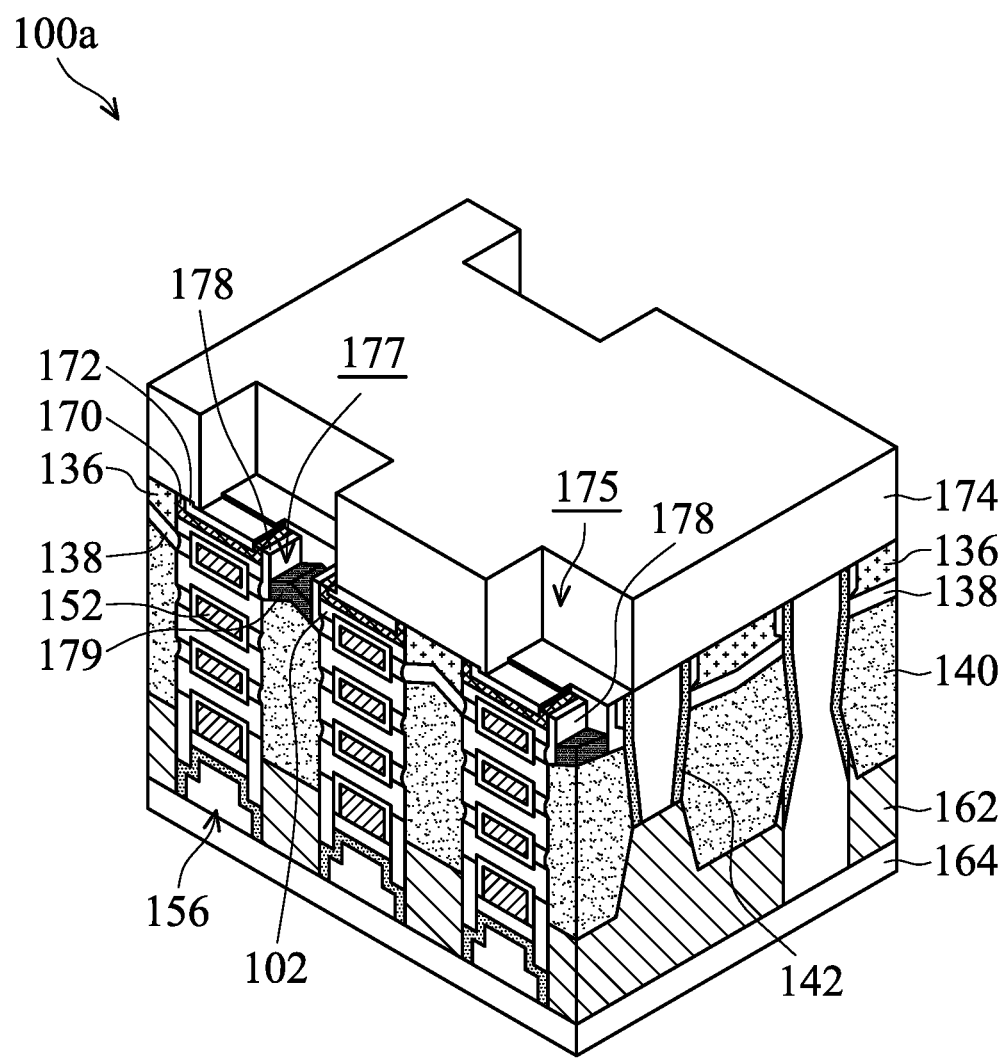
Figure 1V:
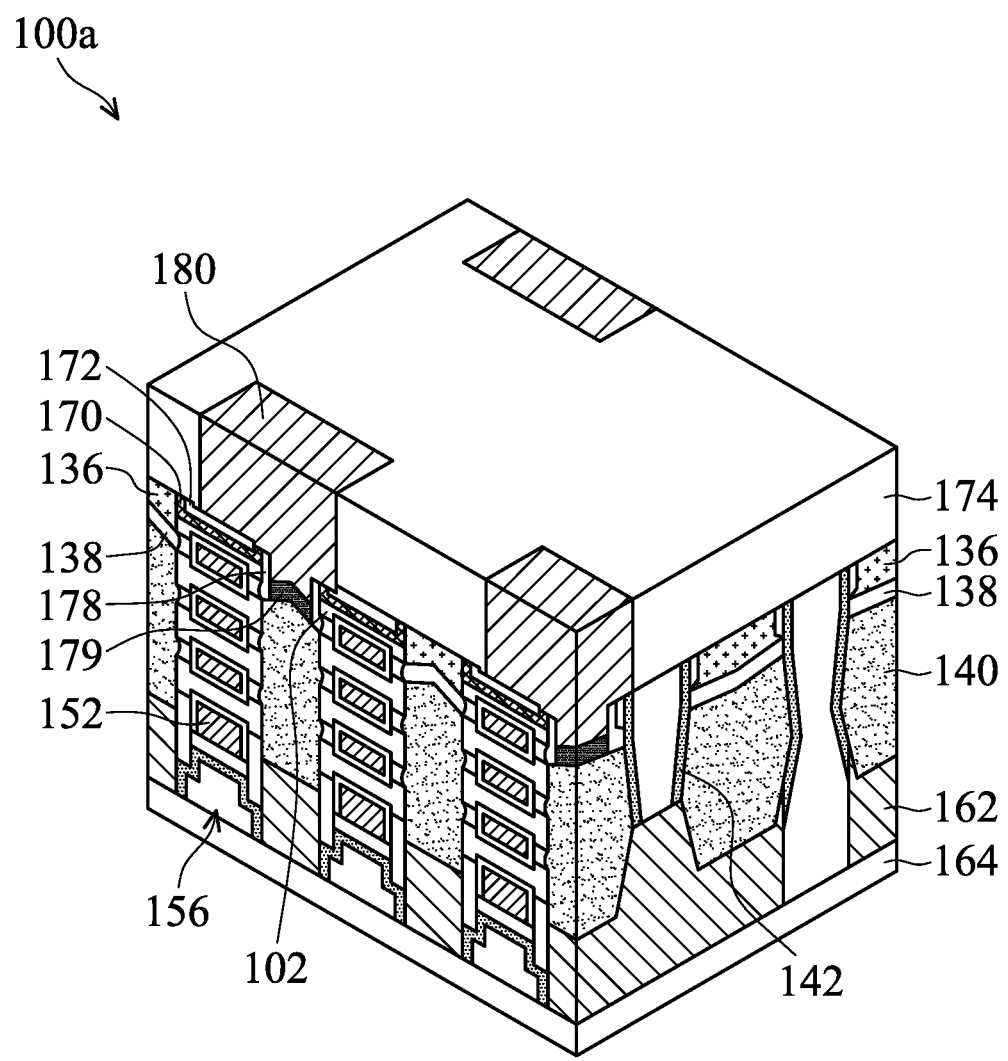
Figure 1W:
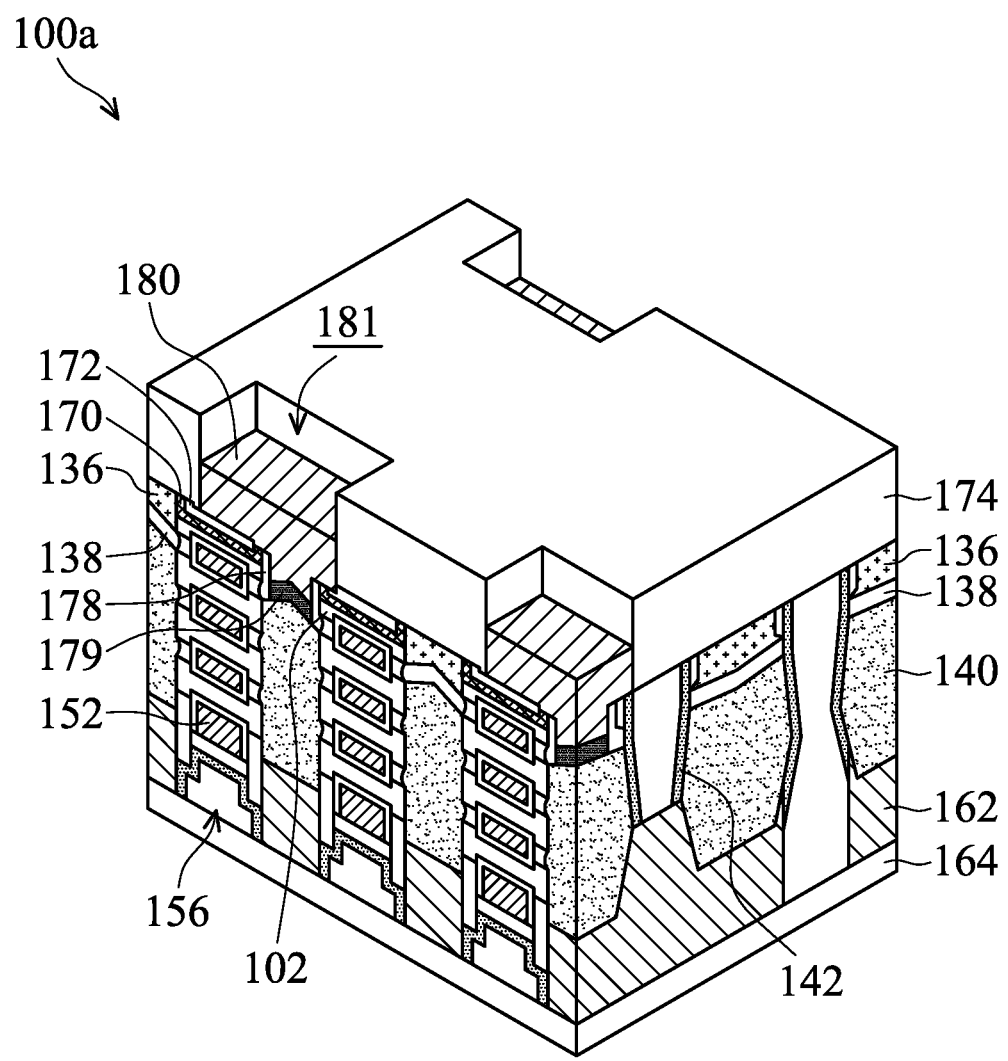
Figure 1X:
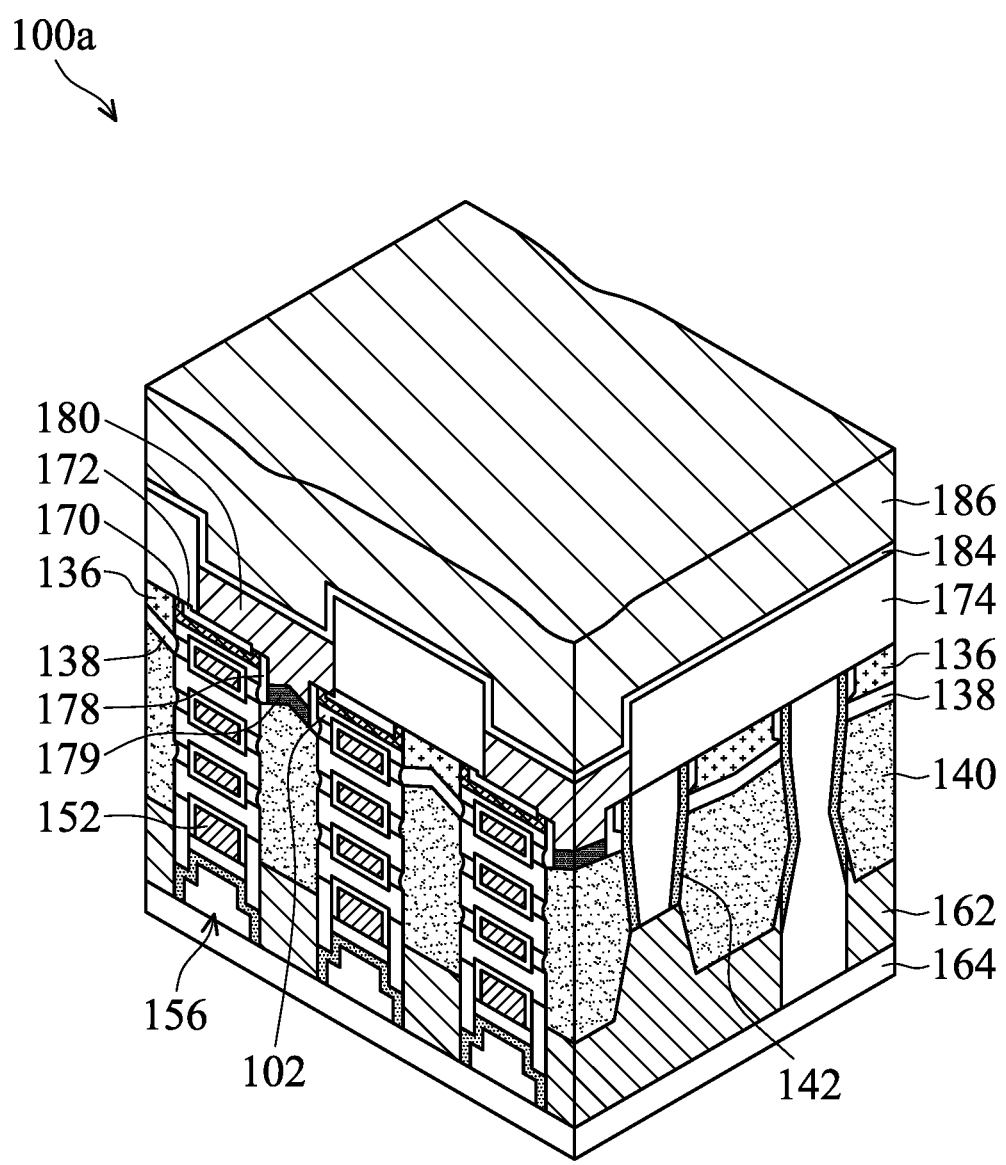
Figure 1Y:
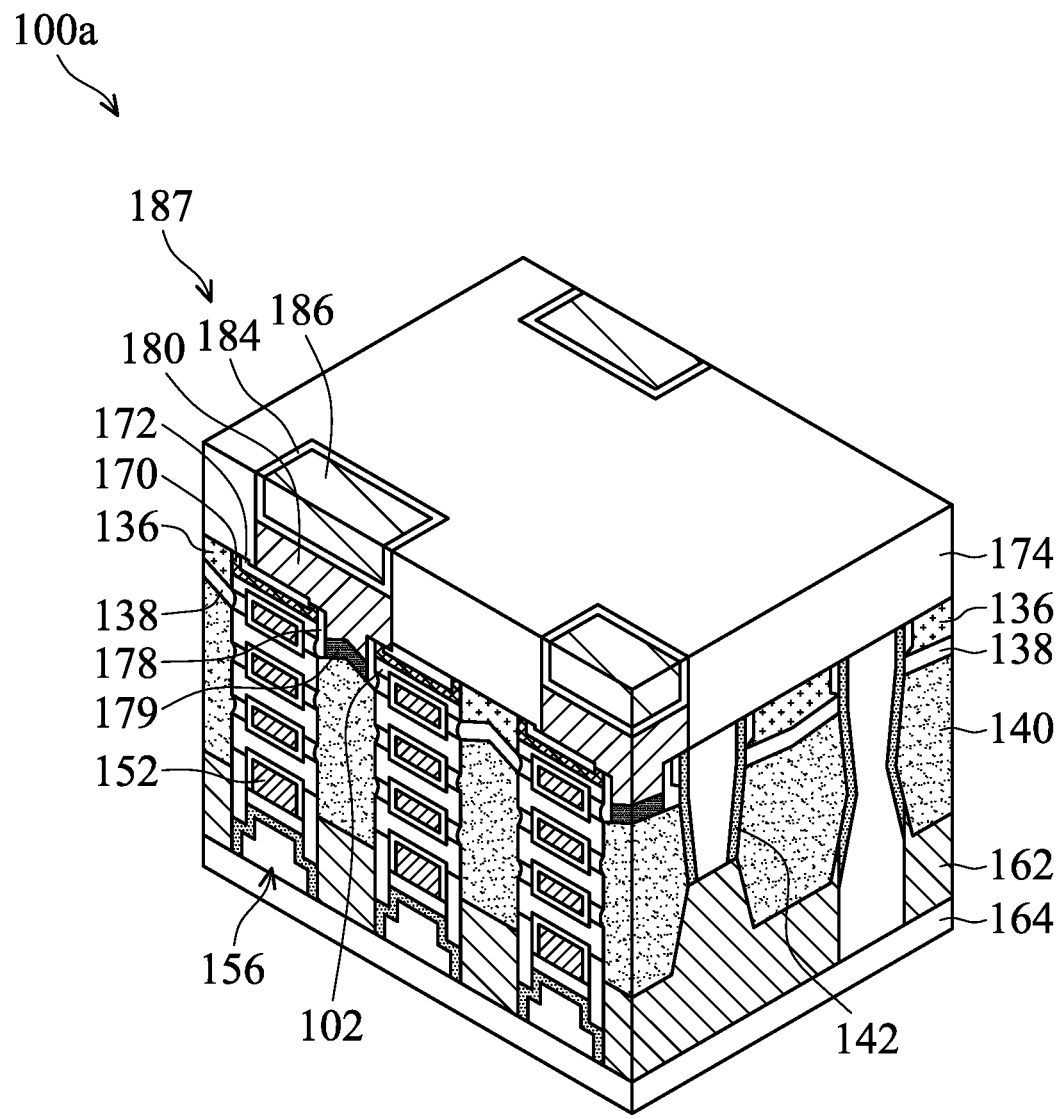
Figure 1Z:
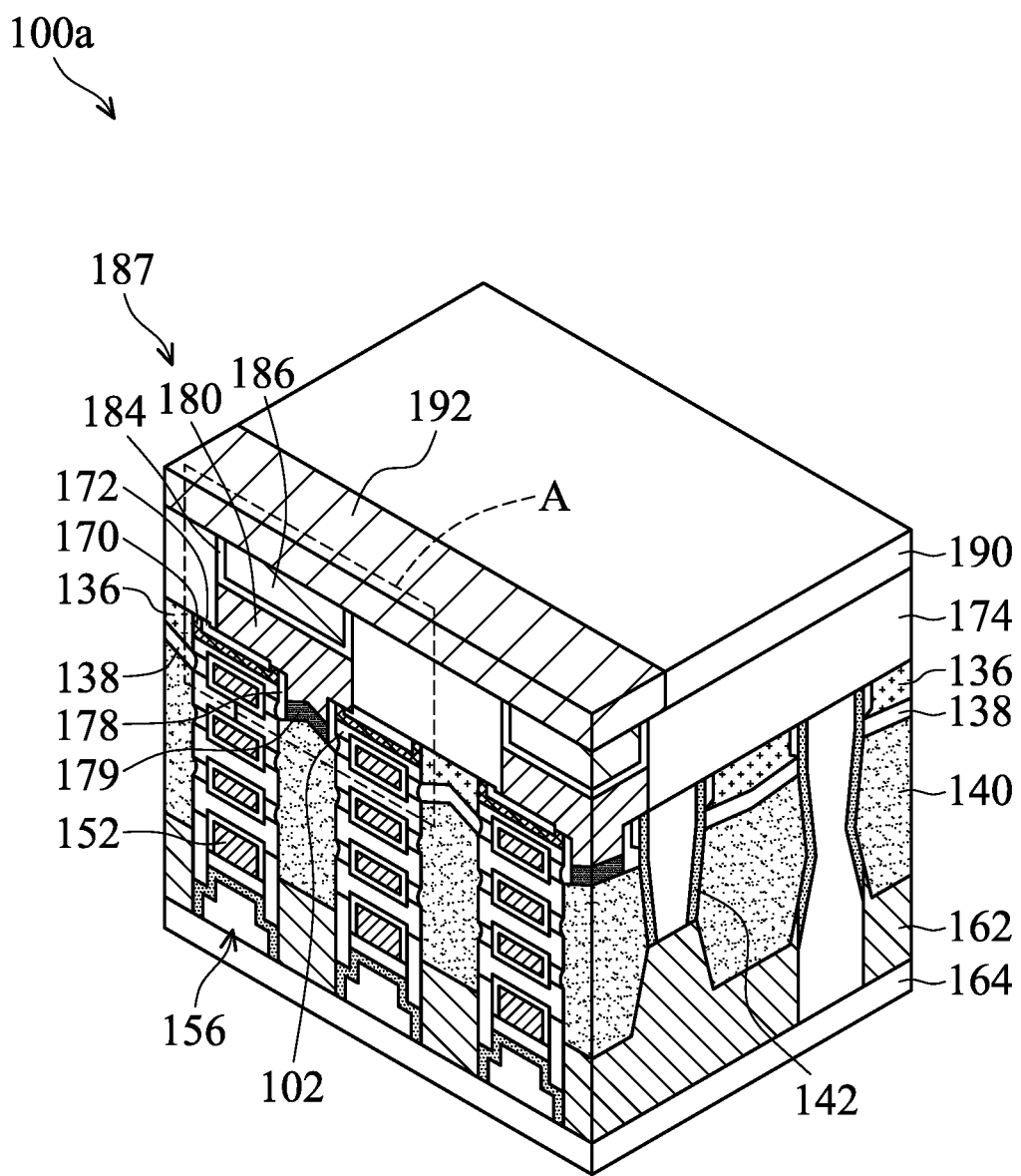

FIGS. 1A to 1Z illustrate diagrammatic perspective views of intermediate stages of manufacturing a semiconductor structure 100a in accordance with some embodiments. In addition, the figures may have been simplified for the sake of clarity to better understand the inventive concepts of the present disclosure. Additional features may be added in the semiconductor structure 100a, and some of the features described below may be replaced, modified, or eliminated.

The semiconductor structure 100a may include multi-gate devices and may be included in a microprocessor, a memory, or other IC devices. For example, the semiconductor structure 100 may be a portion of an IC chip that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or a combination thereof.

First, as shown in FIG. 1A, a semiconductor stack, including first semiconductor material layers 106 and second semiconductor material layers 108, is formed over a substrate 102, in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102 to form the semiconductor stack. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although two first semiconductor material layers 106 and two second semiconductor material layers 108 are shown in FIG. 1A, the semiconductor structure may include more or fewer first semiconductor material layers 106 and second semiconductor material layers 108. For example, the semiconductor structure may include two to five of the first semiconductor material layers 106 and two to five of the second semiconductor material layers 108.

The first semiconductor material layers 106 and the second semiconductor material layers 108 may be formed using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Afterwards, as shown in FIG. 1B, after the first semiconductor material layers 106 and the second semiconductor material layers 108 are formed as the semiconductor material stack over the substrate 102, the semiconductor material stack is patterned to form fin structures 104 extending in a first direction, in accordance with some embodiments.

In some embodiments, the fin structures 104 are protruding from the front side of the substrate 102. In some embodiments, the fin structures 104 include base fin structures 105 and the semiconductor material stacks, including the first semiconductor material layers 106 and the second semiconductor material layers 108, formed over the base fin structure 105.

In some embodiments, the patterning process includes forming mask structures over the semiconductor material stack and etching the semiconductor material stack and the underlying substrate 102 through the mask structure. In some embodiments, the mask structures are a multilayer structure including a pad oxide layer and a nitride layer formed over the pad oxide layer. The pad oxide layer may be made of silicon oxide, which may be formed by thermal oxidation or CVD, and the nitride layer may be made of silicon nitride, which may be formed by CVD, such as LPCVD or plasma-enhanced CVD (PECVD).

Next, as shown in FIG. 1C, after the fin structures 104 are formed, an isolation structure 112 is formed to cover the lower sidewalls of the fin structures 104, in accordance with some embodiments. In some embodiments, the isolation liner (not shown) is formed on sidewalls of the fin structure 104, and it is made of a single or multiple dielectric materials. In some embodiments, the isolation liner includes an oxide layer and a nitride layer formed over the oxide layer. In some embodiments, the isolation structure 112 is made of silicon oxide, silicon nitride, silicon oxynitride (SiON), other applicable insulating materials, or a combination thereof.

The isolation structure 112 may be formed by conformally forming a liner layer covering the fin structures 104, forming an insulating material over the liner layer, and recessing the liner layer and the insulating material to form the isolation liner 110 and the isolation structure 112. The isolation structure 112 is configured to electrically isolate active regions (e.g. the fin structures 104) of the semiconductor structure and is also referred to as shallow trench isolation (STI) feature in accordance with some embodiments. In some embodiments, the isolation structure 112 is directly formed over the substrate 102 around the fin structures 104 without forming the isolation liner.

Afterwards, as shown in FIG. 1D, after the isolation structure 112 is formed, dummy gate structures 116 are formed across the fin structure 104, in accordance with some embodiments.

The dummy gate structures 116 may be used to define the source/drain regions and the channel regions of the resulting semiconductor structure 100. In some embodiments, the dummy gate structures 116 include a dummy gate dielectric layer 118 and a dummy gate electrode layer 120. In some embodiments, the dummy gate dielectric layer 118 is made of one or more dielectric materials, such as silicon oxide, silicon nitride, silicon oxynitride (SiON), $HfO_2$, HfZrO, HfSiO, HTiO, HfAlO, or a combination thereof. In some embodiments, the dummy gate dielectric layer 118 is formed using thermal oxidation, CVD, ALD, physical vapor deposition (PVD), another suitable method, or a combination thereof.

In some embodiments, the dummy gate electrode layer 120 is made of conductive material includes polycrystalline-silicon (poly-Si), poly-crystalline silicon-germanium (poly-SiGe), or a combination thereof. In some embodiments, the dummy gate electrode layer 120 is formed using CVD, PVD, or a combination thereof.

The formation of the dummy gate structures 116 may include conformally forming a dielectric material as the dummy gate dielectric layers 118. Afterwards, a conductive material may be formed over the dielectric material as the dummy gate electrode layers 120, and a hard mask layer 122 may be formed over the conductive material. Next, the dielectric material and the conductive material may be patterned through the hard mask layer 122 to form the dummy gate structures 116. In some embodiments, the hard mask layers 122 include multiple layers, such as an oxide layer 124 and a nitride layer 126. In some embodiments, the oxide layer 124 is silicon oxide, and the nitride layer 126 is silicon nitride.

Next, as shown in FIG. 1E, after the dummy gate structures 116 are formed, gate spacers 128 are formed along and covering opposite sidewalls of the dummy gate structures 116, in accordance with some embodiments. The gate spacers 128 may be configured to separate source/drain structures (formed afterwards) from the dummy gate structures 116. In some embodiments, the gate spacers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

Next, as shown in FIG. 1F, after the gate spacers 128 are formed, source/drain (S/D) recesses 130 are formed adjacent to the gate spacers 128, in accordance with some embodiments. More specifically, the fin structures 104 not covered by the dummy gate structures 116 and the gate spacers 128 are recessed, in accordance with some embodiments.

In some embodiments, the fin structures 104 are recessed by performing an etching process. The etching process may be an anisotropic etching process, such as dry plasma etching, and the dummy gate structure 116 and the gate spacers 128 may be used as etching masks during the etching process.

Next, as shown in FIG. 1G, after the S/D recesses 130 are formed, the first semiconductor material layers 106 exposed by the S/D recesses 130 are laterally recessed to form notches 132, in accordance with some embodiments.

In some embodiments, an etching process is performed to laterally recess the first semiconductor material layers 106 of the fin structure 104 from the S/D recesses 130. In some embodiments, during the etching process, the first semiconductor material layers 106 have a greater etching rate (e.g. etching amount) than the second semiconductor material layers 108, thereby forming notches 132 between the adjacent second semiconductor material layers 108. In some embodiments, the etching process is an isotropic etching such as dry chemical etching, remote plasma etching, wet chemical etching, another suitable technique, and/or a combination thereof.

Next, as shown in FIG. 1H, inner spacers 134 are formed in the notches 132 between the second semiconductor material layers 108, in accordance with some embodiments. The inner spacers 134 may be configured to separate the source/drain structures and the gate structures formed in subsequent manufacturing processes. In some embodiments, the inner spacers 134 have curved sidewalls. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

Next, as shown in FIG. 1I, an epitaxial sacrificial structure 136 is formed and embedded in the fin structures 104, so they can be replaced in the formation of a back side S/D contact structure 187 (formed later, shown in FIG. 1Y) in subsequent manufacturing processes. The epitaxial sacrificial structures 136 are configured to be removed and replaced by the back side S/D contact structure 187 afterwards. In some embodiments, the bottommost surface of the epitaxial sacrificial structure 136 is lower than the bottommost surface of the isolation structure 112.

In some embodiments, the epitaxial sacrificial structure 136 is mad of undoped SiGe, SiGeB, SiB, or another applicable material. In some embodiments, the epitaxial sacrificial structure 136 is formed using an epitaxial growth process, such as Molecular beam epitaxy (MBE), Metal organic CVD (MOCVD), vapor phase epitaxy (VPE), other applicable epitaxial growth process, or a combination thereof.

Next, as shown in FIG. 1J, a dielectric layer 138 is formed over the epitaxial sacrificial structure 136, in accordance with some embodiments. The dielectric layer 138 is configured to isolate the epitaxial sacrificial structure 136 from the S/D structures (140, as shown in FIG. 1J, formed later). The dielectric layer 138 is in direct contact with the inner spacer 134. In addition, the dielectric layer 138 is also formed on the gate spacer 128 and the hard mask layer 122 (not shown). In some embodiments, the dielectric layer 138 is formed on the top surface of the epitaxial sacrificial structure 136 and the top surface of the isolation structure 112. In some other embodiments, the dielectric layer 138 has a vertical portion and horizontal portion, and the horizontal portion is thicker than the vertical portion.

In some embodiments, the dielectric layer 138 is made of be SiO, AlO, AlON, ZrO, HfO, TiO, ZrAlO, ZnO, SiN, SiOCN, SiCN or another applicable material. In some embodiments, the dielectric layer 138 is formed by a deposition process, such as chemical vapor deposition (CVD), physical vapor deposition, (PVD), atomic layer deposition (ALD), or another applicable processes. In some embodiments, the dielectric layer 138 has a thickness in a range from about 1 nm to about 10 nm.

Afterwards, as shown in FIG. 1K, source/drain (S/D) structures 140 are formed over the dielectric layer 138, in accordance with some embodiments. The dielectric layer 138 is configured to reduce the leakage of the S/D structure 140. The S/D structures 140 are isolated from the epitaxial sacrificial structures 136 by the dielectric layer 138. The source/drain (S/D) structures or region(s) may refer to a source or a drain, individually or collectively dependent upon the context.

In some embodiments, the S/D structures 140 are formed using an epitaxial growth process, such as MBE, MOCVD, VPE, other applicable epitaxial growth process, or a combination thereof. In some embodiments, the S/D structures 140 are made of any applicable material, such as Ge, Si, GaAs, AlGaAs, SiGe, GaAsP, SiP, SiC. SiCP, or a combination thereof. In some embodiments, the S/D structures 140 are in-situ doped during the epitaxial growth process. For example, the S/D structures 140 may be the epitaxially grown SiGe doped with boron (B). For example, the S/D structures 140 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 140 are doped in one or more implantation processes after the epitaxial growth process.

Afterwards, as shown in FIG. 1L, after the S/D structures 140 are formed, a contact etch stop layer (CESL) 142 is conformally formed to cover the source/drain structures 140 and dummy gate structures 116, and an interlayer dielectric (ILD) layer 144 is formed over the CESL 142, in accordance with some embodiments.

In some embodiments, the CESL 142 is made of a dielectric materials, such as silicon nitride, silicon oxide, silicon oxynitride, another suitable dielectric material, or a combination thereof. The dielectric material for the CESL 142 may be conformally deposited over the semiconductor structure by performing CVD, ALD, other application methods, or a combination thereof.

The ILD layer 144 may include multilayers made of multiple dielectric materials, such as silicon oxide, silicon nitride, silicon oxynitride, phosphosilicate glass (PSG), borophosphosilicate glass (BPSG), or other applicable low-k dielectric materials. The ILD layer 144 may be formed by chemical vapor deposition (CVD), physical vapor deposition, (PVD), atomic layer deposition (ALD), or other applicable processes.

Next, as shown in FIG. 1M, after the CESL 142 and the ILD layer 144 are deposited, a portion of the ILD layer 144 is removed by a planarization process, in accordance with some embodiments. In some embodiments, the planarization process such as CMP or an etch-back process is performed until the gate electrode layers 120 of the dummy gate structures 116 are exposed Next, as shown in FIG. 1N, the dummy gate structures 116 and the first semiconductor material layers 106 of the fin structures 104 are removed to form gate trenches 146, in accordance with some embodiments. More specifically, the dummy gate structures 116 and the first semiconductor material layers 106 of the fin structures 104 are removed to form nanostructures 108' with the second semiconductor material layers 108 of the fin structures 104, in accordance with some embodiments.

The removal process may include one or more etching processes. For example, when the dummy gate electrode layers 120 are polysilicon, a wet etchant such as a tetramethylammonium hydroxide (TMAH) solution may be used to selectively remove the dummy gate electrode layers 120. Afterwards, the dummy gate dielectric layers 118 may be removed using a plasma dry etching, a dry chemical etching, and/or a wet etching. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Next, as shown in FIG. 1O, gate structures 148 are formed wrapping around the nanostructures 108', in accordance with some embodiments. The gate structures 148 wrap around the nanostructures 108' to form gate-all-around transistor structures, in accordance with some embodiments. In some embodiments, the gate structures 148 include conductive materials such as Ti, TiN, and/or W with dopants such as La, Zr, Hf, or the like.

In some other embodiments, a trimming process is performed before the formation of the gate structures 148, so that the nanostructures 108' at the channel region wrapped by the gate structures 148 are narrower than the nanostructures under the gate spacers 128 and between the inner spacers 134.

In some embodiments, each of the gate structure 148 includes a gate dielectric layer 150 and a gate electrode layer 152. In some embodiments, an interfacial layer is formed before the gate dielectric layer 150 is formed, although not shown in FIG. 1Q. In some embodiments, the interfacial layer is an oxide layer formed around the nanostructures 108' and on the exposed portions of the base fin structures 105. In some embodiments, the interfacial layer is formed by performing a thermal process.

In some embodiments, the gate dielectric layer 150 is formed over the interfacial layer, so that the nanostructures 108' are surrounded (e.g. wrapped) by the gate dielectric layer 150. In addition, the gate dielectric layer 150 also covers the sidewalls of the gate spacers 128, the inner spacers 134, and the nanostructures 108' in accordance with some embodiments.

In some embodiments, the gate dielectric layers 150 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, other applicable high-k dielectric materials, or a combination thereof. In some embodiments, the gate dielectric layers 150 are formed using CVD, ALD, other applicable methods, or a combination thereof.

In some embodiments, the gate electrode layers 152 are formed on the gate dielectric layers 150. In some embodiments, the gate electrode layers 152 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 152 are formed using CVD, ALD, electroplating, another applicable method, or a combination thereof. Other conductive layers, such as work function metal layers, may also be formed in the gate structures 148, although they are not shown in the figures.

Next, as shown in FIG. 1P, after the gate structures 148 are formed, an etch back process is performed to form recesses over the gate structures 148, and metal cap layers 154 and mask structures 156 are formed in the recesses, in accordance with some embodiments.

In some embodiments, an etching process is performed to form the recesses. In some embodiments, the etching process is an isotropic etching such as dry chemical etching, remote plasma etching, wet chemical etching, another suitable technique, and/or a combination thereof. In some embodiments, the gate spacers 128 are partially removed during the etching process, so that the recesses have T shape in the cross-sectional views.

After the recesses are formed, the metal cap layers 154 are formed over the top surfaces of the gate structures 148 in accordance with some embodiments. In some embodiments, the metal cap layers 154 are made of metal such as W, Re, Ir, Co, Ni, Ru, Mo, Al, Ti, Ag, Al, other applicable metals, or multilayers thereof. In some embodiments, the metal cap layers 154 and the metal gate electrode layer 152 are made of different materials. In some embodiments, the metal cap layers 154 covers both the gate dielectric layers 150 and the gate electrode layers 152 and are in contact with the sidewalls of the gate spacers 128. In some embodiments, the top surfaces of the metal cap layers 154 are lower than the top portions of the gate spacers 128.

After the metal cap layers 154 are formed, the mask structures 156 are formed in the recesses over the metal cap layers 154 and over the gate spacers 128, in accordance with some embodiments. In some embodiments, the mask structures are bi-layered structure including a lining layer 158 and a bulk layer 160 over the lining layer 158. The mask structures 156 are configured to protect the gate spacer 128 and the gate structures 148 during the subsequent etching process for forming contact plugs.

In some embodiments, the mask structures 156 have narrower bottom portions and wider top portions. In some embodiments, the mask structures 156 have T-shapes in cross-sectional views. In some embodiments, the mask structures 156 are in direct contact with the contact etch stop layers 142.

In some embodiments, the lining layer 158 is made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide (SiO2), or a combination thereof. In some embodiments, the dielectric material for forming the lining layer 158 is conformally deposited using such as ALD, CVD (such as LPCVD, PECVD, HDP-CVD, or HARP), or the like.

In some embodiments, the bulk layer 160 is made of dielectric material such as silicon oxide (SiO2), silicon nitride (SiN), silicon oxynitride (SiON), silicon carbon nitride (SiCN), silicon oxycarbonitride (SiOCN), oxygen-doped silicon carbonitride (Si(O)CN), or a combination thereof. In some embodiments, the dielectric material for the bulk layer 160 is formed over the lining layer 158 to overfill the recesses using such as CVD (such as FCVD, LPCVD, PECVD, HDP-CVD or HARP), ALD, or the like. In some embodiments, the bulk layer 160 and the lining layer 158 are made of different materials. In some embodiments, the bulk layer 160 is made of an oxide (such as silicon oxide) and the lining layer 158 is made of a nitrogen-containing dielectric (such as silicon nitride or silicon oxynitride). Afterward, a planarization process is performed on the bulk layer 160 and the lining layer 158 until the ILD layer 144 is exposed. The planarization may be CMP, an etching back process, or a combination thereof.

After the mask structures 156 are formed, front side source/drain (S/D) contact structure 162 are formed through the ILD layer 144 and the CESL 142 over the S/D structures 140. In some embodiments, some of the front side source/drain (S/D) contact structure 162 overlap more than one of the fin structures 104. The formation of the front side S/D contact structure 162 may include patterning the ILD layer 144 and the CESL 142 to form contact openings partially exposing the S/D structures 140, forming a silicide layer (not shown), and forming a conductive material over the silicide layer. The patterning process may include forming a patterned mask layer using a photolithography process over the ILD layer 144 followed by an anisotropic etching process.

The silicide layers may be formed by forming metal layers over the top surface of the S/D structures 140 and annealing the metal layers so the metal layers react with the S/D structures 140 to form the silicide layers. The unreacted metal layers may be removed after the silicide layers are formed. The silicide layers may be made of WSi, NiSi, TiSi, TaSi, PtSi, WSi, CoSi, or the like.

After the silicide layer is formed, the conductive material may be formed in the contact openings to form the front side S/D contact structure 162. The conductive material may include ruthenium (Ru), cobalt (Co), copper (Cu), titanium (Ti), titanium nitride (TiN), tantalum (Ta), tantalum nitride (TaN), molybdenum (Mo), nickel (Ni), aluminum (Al) tungsten (W), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

In some embodiments, the conductive material for forming the front side S/D contact structure 162 is different from that for forming the gate structures. The conductive material may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Liners and/or barrier layers (not shown) may be formed before the formation of the conductive materials of the front side S/D contact structure 162. The liners may be made of silicon nitride, although any other applicable dielectric may be used as an alternative. The barrier layer may be made of tantalum nitride, although other materials, such as tantalum, titanium, titanium nitride, or the like, may also be used.

Next, as shown in FIG. 1P, after the front side S/D contact structure 162 are formed, a front end structure 164 is formed over the mask structures 156, the ILD layer 144, and the front side S/D contact structure 162, and a carrier substrate 166 is formed over the front end structure 164, in accordance with some embodiments.

In some embodiments, the front end structure 164 includes an etch stop layer and various features (not shown), such as a multilayer interconnect structure (e.g., contacts to gate, vias, lines, inter metal dielectric layers, passivation layers, etc.), formed thereon.

Next, as shown in FIG. 1Q, after the front end structure 164 is formed, a carrier substrate 166 (not shown) is attached to the front end structure 164, and then the substrate 102 is turned upside down, and a planarization is performed on the back side of the substrate 102, in accordance with some embodiments. More specifically, a planarization is performed on the substrate 102 until the isolation structure 112, the epitaxial sacrificial structures 136 and the CESL 142 are exposed. In some embodiments, a portion of the dielectric layer 138 which is directly on the isolation structure 112 is removed.

The planarization process may be an etching process, a CMP process, a mechanical grinding process, a dry polishing process, or a combination thereof. The front end structure 164 is configured to support the semiconductor structure in subsequent manufacturing process.

It is appreciated that although the structures in FIGS. 1Q-1Z are shown in upside down for better understanding the manufacturing processes, the spatial positions of the elements (e.g. top portions, bottom portions, topmost, bottommost, or the like) are described according to the original positions shown in FIGS. 1A to 1P so they can be in consistence with those described previously for clarity. For example, the front side surface of the S/D structure 140 is referred to the surface in contact with the S/D contact structure 162, and the back side surface of the S/D structures 140 is referred to the surface in contact with the substrate 102, since the structure shown in FIG. 1Q is upside down.

Afterwards, as shown in FIG. 1R, a portion of the substrate 102 is removed to form a recess 167, in accordance with some embodiments. As a result, the substrate 102 is exposed by the recess 167. In some embodiments, the substrate 102 is removed by dry etching process. In some embodiments, the substrate 102 is made of Si, and the epitaxial sacrificial structures 136 are made of undoped SiGe. Since the epitaxial sacrificial structure 136 has a high etching selectivity with respect to the substrate 102, the substrate 102 is removed while the epitaxial sacrificial structures 136 are left.

Afterwards, as shown in FIG. 1S, after the recess 167 is formed, a liner layer 170 and a dielectric layer 172 are sequential formed in the recess 167, and a polishing process (e.g. CMP) is performed until the epitaxial sacrificial structures 136 are exposed, in accordance with some embodiments.

In some embodiments, the liner layer 170 is not made of oxide. In some embodiments, the liner layer 170 is made of SiN, SiCN or another applicable material. In some embodiments, the liner layer 170 is formed by a deposition process, such as chemical vapor deposition (CVD), physical vapor deposition, (PVD), atomic layer deposition (ALD), or another applicable processes. In some embodiments, the liner layer 170 has a thickness in a range from about 0.3 nm to about 3 nm.

In some embodiments, the dielectric layer 172 is made of SiO, SiOC, AlO, AlON, ZrO, HfO, TiO, ZrAlO, ZnO, SiOCN, SiOCN, SiCN or another applicable material. In some embodiments, the dielectric layer 172 is formed by a deposition process, such as chemical vapor deposition (CVD), physical vapor deposition, (PVD), atomic layer deposition (ALD), or another applicable processes. In some embodiments, the dielectric layer 172 has a thickness in a range from about 5 nm to about 30 nm. In some embodiments, the dielectric layer 172 has a width in a range from about 5 nm to about 30 nm.

Afterwards, as shown in FIG. 1T, a mask layer 174 is formed over the dielectric layer 172 and the epitaxial sacrificial structures 136, and the mask layer 174 is patterned to form an opening 175, in accordance with some embodiments. Afterwards, a portion of the epitaxial sacrificial structures 136 is removed by using the mask layer 174 as the mask. As a result, a trench 177 is formed to expose the S/D structure 140. In addition, a portion of the liner layer 170 and a portion of the dielectric layer 172 are removed.

Next, a liner layer 178 is formed on a sidewall of the trench 177. More specifically, the liner layer 178 lining on the sidewall of the trench 177. The material of liner layer 178 is conformally formed in the trench 177, the opening 175, on the liner layer 170 and the S/D structure 140. Next, a portion of the material of the liner layer 178 is removed by a dry etching process to form the liner layer 178 and to expose the S/D structure 140. The liner layer 178 is configured to increase the isolation between the first conductive material 180 (formed later) and the gate structure 148. The liner layer 178 is in direct contact with the inner spacer 134, the substrate 102, the liner layer 170.

In some embodiments, the mask layer 174 is made of SiO, SiOC, AlO, AlON, ZrO, HfO, TiO, ZrAlO, ZnO, SiOCN, SiOCN, SiCN or another applicable material. In some embodiments, the mask layer 174 is formed by a deposition process, such as chemical vapor deposition (CVD), physical vapor deposition, (PVD), atomic layer deposition (ALD), or another applicable processes. In some embodiments, the mask layer 174 has a thickness in a range from about 5 nm to about 120 nm.

In some embodiments, the liner layer 170 and the liner layer 178 are made of different materials. In some embodiments, the liner layer 178 is made of SiO, AlO, AlON, ZrO, HfO, TiO, ZrAlO, ZnO, SiN, SiOCN, SiCN or another applicable material. In some embodiments, the liner layer 178 is formed by a deposition process, such as chemical vapor deposition (CVD), physical vapor deposition, (PVD), atomic layer deposition (ALD), or another applicable processes. In some embodiments, the liner layer 178 has a thickness in a range from about 1 nm to about 10 nm.

It should be noted that since the dielectric layer 172 has a high etching selectivity with respect to the epitaxial sacrificial structures 136, the epitaxial sacrificial structures 136 is removed while the dielectric layer 172 is not removed or removed slightly. The dielectric layer 172 has the self-aligned function, and it can called as a self-aligned dielectric layer 172.

Afterwards, as shown in FIG. 1U, a silicide layer 179 is formed on the exposed S/D structure 140. The silicide layer 179 is in direct contact with the S/D structure 140 and the liner layer 178. The silicide layer 179 may be formed by forming metal layers over the top surface of the S/D structures 140 and annealing the metal layers so the metal layers react with the S/D structures 140 to form the silicide layers. The unreacted metal layers may be removed after the silicide layers are formed. The silicide layers may be made of TiSi, MoSi, NiSi, CoSi, WSi, RuSi, TaSi, PtSi, WSi, or the like.

In some embodiments, the silicide layer 179 has a thickness in a range from about 5 nm to about 120 nm.

Next, as shown in FIG. 1V, a first conductive material 180 is formed in the opening 175 and the trench 177, and then a polishing process (e.g. CMP) is performed until the mask layer 174 is exposed, in accordance with some embodiments. More specifically, the first conductive material 180 is formed on the S/D structure 140, the remaining dielectric layer 172.

In some embodiments, the first conductive material 180 is made of W, Ru, Co. Cu, Ti, TiN, Ta, TaN, Mo, Ni or another applicable material. In some embodiments, the first conductive material 180 is formed by a deposition process, such as chemical vapor deposition (CVD), physical vapor deposition, (PVD), atomic layer deposition (ALD), or another applicable processes.

Afterwards, as shown in FIG. 1W, a portion of the first conductive material 180 is removed to form a recess 181, in accordance with some embodiments. In some embodiments, the portion of the first conductive material 180 is removed by an etching process, such as wet etching or dry etching. In some embodiments, the etching process is performed by using gas comprising F, Cl, $H_2$, $O_2$, $N_2O$ or $N_2$ or another applicable materials. In some embodiments, the etching process is performed by using gas in a flow in a range from about 10 sccm to about 300 sccm. In some embodiments, the etching process is performed at bias voltage in a range from 100V to about 800V. In some embodiments, the etching process is performed at a temperature in 20° C. to about 90° C. In some embodiments, the etching process is performed at power in a range from 300 W to about 1000 W.

Next, as shown in FIG. 1X, a glue layer 184 is formed over the first conductive material 180, and a second conductive material 186 is formed over the glue layer 184, in accordance with some embodiments. The glue layer 184 is configured to use as a barrier layer to prevent the first conductive material 180 from diffusing into the second conductive material 186 or the conductive layer 192 (formed later). In some other embodiments, no glue layer 184 is between the first conductive material 180 and the second conductive material 186.

In some embodiments, the glue layer 184 is made of TiN. TaN or applicable materials. In some embodiments, the glue layer 184 is formed by a deposition process, such as chemical vapor deposition (CVD), physical vapor deposition, (PVD), atomic layer deposition (ALD), or another applicable process. In some embodiments, the glue layer 184 has a thickness in a range from about 0.3 nm to about 3 nm.

The first conductive material 180 and the second conductive material 186 are made of different material. In some embodiments, the second conductive material 186 is made of W, Ru, Co, Cu, Ti, TiN, Ta, TaN, Mo, Ni or another applicable material. In some embodiments, the second conductive material 186 is formed by a deposition process, such as chemical vapor deposition (CVD), physical vapor deposition, (PVD), atomic layer deposition (ALD), or another applicable process.

Afterwards, as shown in FIG. 1Y, a portion of the second conductive material 186 is removed to expose the mask layer 174, in accordance with some embodiments. A back-side S/D contact structure 187 is constructed by the first conductive material 180, the glue layer 184 and the second conductive material 186. Note that the front side source/drain (S/D) contact structure 162 and the back-side S/D contact structure 187 are respectively formed on opposite sides of the S/D structure 140. The back-side S/D contact structure 187 is electrically connected to the front side S/D contact structure 162 by the S/D structure 140. The epitaxial sacrificial structure 136 is adjacent to the back-side S/D contact structure 187, and the dielectric layer 138 is between the S/D structure 140 and the epitaxial sacrificial structure 136.

Next, as shown in FIG. 1Z, a dielectric layer 190 is formed over the mask layer 174, the dielectric layer 190 is patterned to form an opening (not shown), and a conductive layer 192 is formed in the opening, in accordance with some embodiments. The conductive layer 192 is electrically connected to the S/D structure 140 by the back-side S/D contact structure 187.

In some embodiments, the conductive layer 192 is made of W, Co, Moly, Ru or another applicable material. In some embodiments, a liner (not shown) is formed before the conductive layer 192, the liner is made of TaN, TiN, Ru, Co or another applicable material.

In some embodiments, the dielectric layer 190 is made of SiO, SiOC, AlO, AlON, ZrO, HfO, TiO, ZrAlO, ZnO, SiOCN, SiOCN, SiCN or another applicable material. In some embodiments, the dielectric layer 190 is formed by a deposition process, such as chemical vapor deposition (CVD), physical vapor deposition, (PVD), atomic layer deposition (ALD), or another applicable process.

It should be note that if no second conductive material is between the first conductive material 180 and the conductive layer 192, the first conductive material 180 may react with the conductive layer 192. This phoneme is called as miscible between two conductive materials. In other words, the material of the first conductive material 180 may diffuse into the conductive layer 192. Once the material of the first conductive material 180 diffuses into the conductive layer 192, some unwanted voids may occur in the first conductive material 180 to reduce the reliability of the semiconductor structure 100a. In order to prevent the diffusion, the second conductive material 186 is formed between the first conductive material 180 and the conductive layer 192 to configure as a block layer.

For example, in some embodiments, when the first conductive material 180 is made of tungsten (W), and the conductive layer 192 is made of molybdenum (Mo), tungsten (W) may diffuse, miscible and interact with molybdenum (Mo), and the second conductive material 186 is made of copper (Co) or ruthenium (Ru) to block the reaction. For example, in some embodiments, when the first conductive material 180 is made of ruthenium (Ru), and the conductive layer 192 is made of cobalt (Co), ruthenium (Ru) may diffuse and interact with cobalt (Co), and the second conductive material 186 is made of tungsten (W) to block the reaction. The second conductive material 186 is interposed between the first conductive material 180 and the conductive layer 192 to prevent the diffusion.

In some embodiments, the first conductive material 180 and the second conductive material 186 are made of different materials. In some embodiments, the second conductive material 186 and the conductive layer 192 are made of different materials. In some embodiments, the first conductive material 180, the second conductive material 186 and the conductive layer 192 are made of different materials.

Since the trench 177 (shown in FIG. 1T) has a higher aspect ratio with respect to the aspect ratio of the recess 181, the filling of first conductive material 180 may case voids. By removing a portion of the first conductive material 180, the voids are also removed along the first conductive material 180. In addition, the second conductive material 186 is filled into the recess 188 with low aspect ratio, the risk of the formation of the voids are greatly reduced. Therefore, the voids in the back side S/D contact structure 187 is reduced by two-layered formation of the first conductive material 180 and the second conductive material 186, and the reliability of the semiconductor structure 100a is improved.

Figure 2:
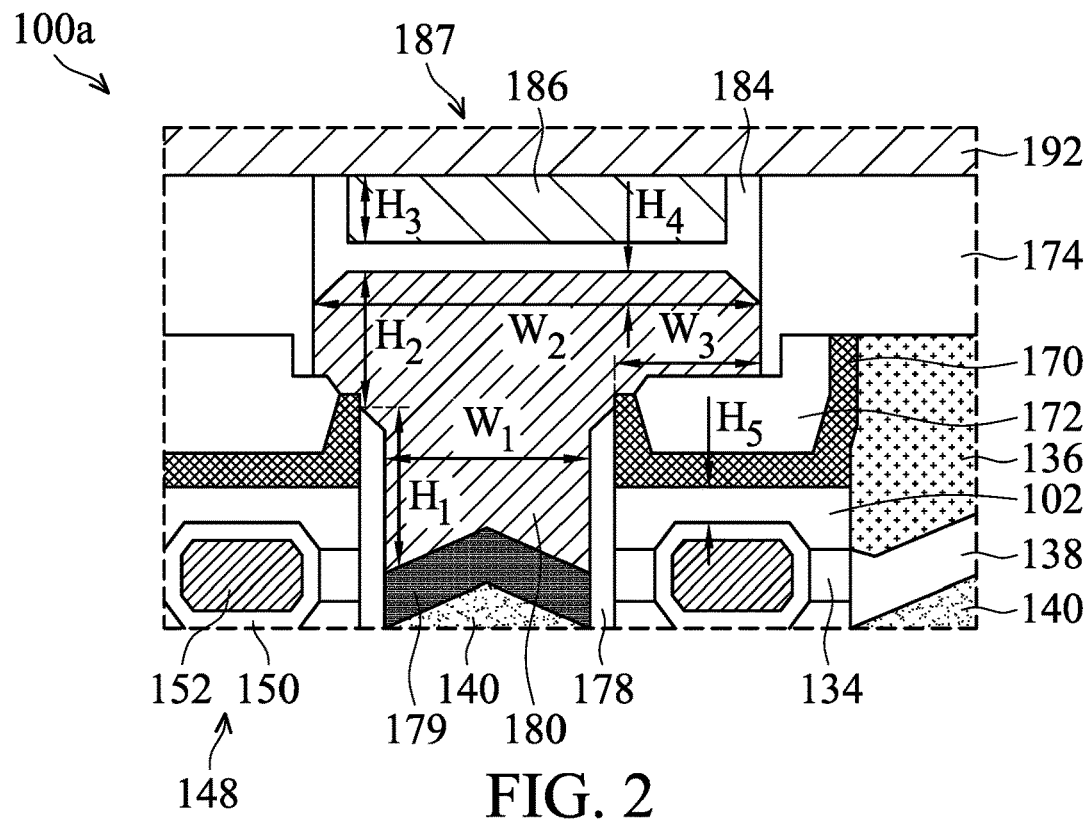
FIG. 2 shows an enlarged cross-sectional view of the semiconductor structure of region A of FIG. 1Z, in accordance with some embodiments.

FIG. 2 shows an enlarged cross-sectional view of the semiconductor structure 100a of region A of FIG. 1Z, in accordance with some embodiments.

As shown in FIG. 2, the S/D structure 140 is adjacent to the nanostructures 108', and the front side S/D contact structure 162 is formed on a first side of the S/D structure 140, and the back-side S/D contact structure 187 is formed on a second side of the S/D structure 140. The first side is oppositely to the second side. The back-side S/D contact structure 187 includes a first portion and a second portion over the first portion, the first portion includes the first conductive material 180, and the second portion includes the second conductive material 186. The second portion further includes the glue layer 184. In other words, the glue layer 184 is between the first conductive material 180 and the second conductive material 186. The first portion and the second portion are made of different materials. The second portion and the conductive layer 192 are made of different materials. The front side S/D contact structure 162 and the first portion of the back-side S/D contact structure 187 are made of different materials.

The second portion of the back-side S/D contact structure 187 is configured to prevent the first portion from diffusing into the conductive layer 192. The first portion extends from a first position to a second position, the first position is between two adjacent nanostructures 108', and the second position is above the nanostructures 108'. In other words, the first conductive material 180 is between two adjacent nanostructures 108, and the second conductive material 186 above the gate structure 142 and the nanostructures 108'.

The S/D structure 140 has a first width $W_1$. The second conductive material 186 has a second width $W_2$. The first width W, is smaller than the second width $W_2$. In some embodiments, the first width $W_1$ is in a range from about 5 nm to about 30 nm.

The first conductive material 180 has a top portion and a bottom portion, the top portion is wider than the bottom portion, and thus the first conductive material 180 has a T-shaped structure. The bottom portion of the first conductive material 180 is between two adjacent nanostructures 108', and the top portion of the first conductive material 180 is higher than the top surface of the liner layer 178. In some embodiments, the bottom portion of the first conductive material 180 has a first height $H_1$, and the top portion of the first conductive material 180 has a second height $H_2$. In some embodiments, the first height $H_1$ is in a range from about 10 nm to about 20 nm. In some embodiments, the second height $H_2$ is in a range from about 10 nm to about 20 nm.

The second material 186 has a third height $H_3$. In some embodiments, the third height $H_3$ is in a range from about 10 nm to about 20 nm. The profile of the top portion of the first conductive material 180 has a protrusion portion due to the etching process. The protrusion portion has a fourth height $H_4$ along a vertical direction. In some embodiments, the fourth height $H_4$ is in a range from about 0.3 nm to about 3 nm.

The dielectric layer 172 is formed over the gate structure 148 and the remaining substrate 102. The dielectric layer 172 is in direct contact with the top portion of the first conductive material 180 of the back-side S/D contact structure 187. It should be noted that the portion of dielectric layer 172 is removed when forming the trench 177 (shown in FIG. 1T). Therefore, the dielectric layer 172 has a step-liked portion. In some embodiments, the dielectric layer 172 has a loss in a rage from about 0.1 to about 10 nm along a vertical direction.

The top portion of the first conductive material 180 of the back-side S/D contact structure 187 overlaps or covers the dielectric layer 172, and the overlapping portion has a width $W_3$. In some embodiments, the third width $W_3$ is in a range from about 0.1 nm to about 10 nm.

The liner layer 170 is between the dielectric layer 172 and the top portion of the first conductive material 180 of the back-side S/D contact structure 187. In some embodiments, the topmost surface of the liner layer 170 is lower than the topmost surface of the dielectric layer 172. In some embodiments, the topmost surface of the liner layer 170 is higher than the topmost surface of the liner layer 178 and lower than the topmost surface of the dielectric layer 172. In some other embodiments, no liner layer is between the dielectric layer 172 and the top portion of the first conductive material 180 of the back-side S/D contact structure 187, and the dielectric layer 172 is in direct contact with the substrate 102 and the liner layer 178.

The liner layer 178 is between the first conductive material 180 and the nanostructures 108. In some embodiments, the liner layer 178 has a sloped top surface. In some embodiments, the liner layer 178 has a tapered width from bottom to top.

The remaining substrate 102 has a fifth height $H_5$. In some embodiments, the fifth height $H_5$ is in a range from about 0.5 nm to about 20 nm. In some other embodiments, the substrate 102 is completely removed, and there are no remaining substrates.

The top surface of the second conductive material 186 may be planar or recessed (or curved, dishing). In some embodiments, a distance between the recessed top surface of second conductive material 186 and the topmost surface of the glue layer 184 is in a range from about 0.3 nm to about 3 nm. The conductive layer 192 is on the second conductive material 186, and the conductive layer 192 and the second conductive material 186 are made of different materials.

Figure 3:
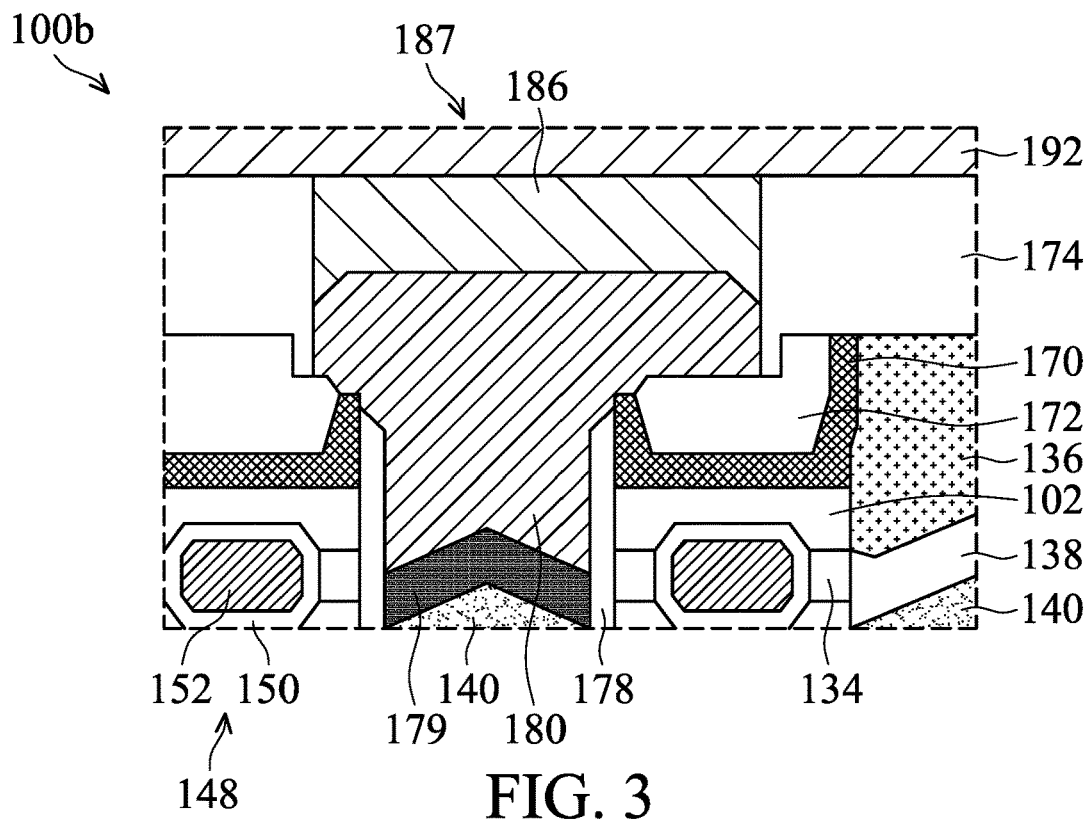
FIG. 3 shows a cross-sectional view of a semiconductor device structure, in accordance with some embodiments.

FIG. 3 shows a cross-sectional view of a semiconductor device structure 100b, in accordance with some embodiments. The semiconductor device structure 100b of FIG. 3 includes elements that are similar to, or the same as, elements of the semiconductor device structure 100a of FIG. 1Z, the difference between FIG. 3 and FIG. 1Z is that, no glue layer is between the first conductive material 180 and the second conductive material 186.

Figure 4:
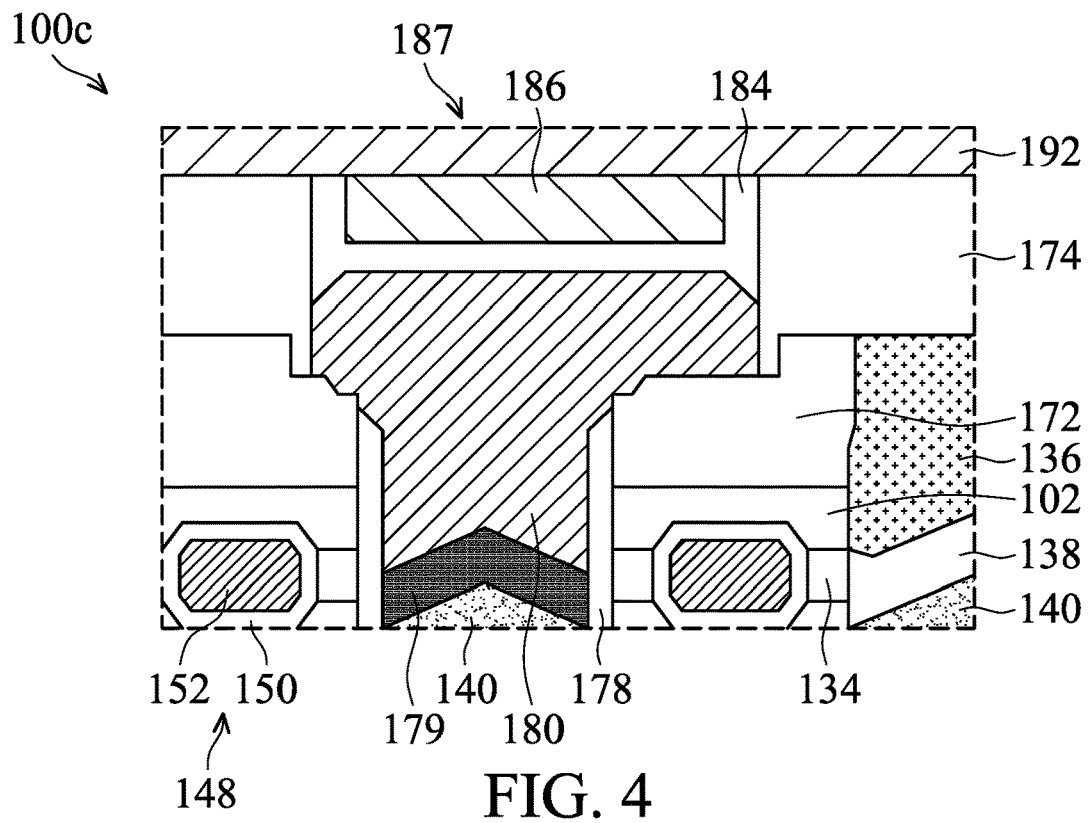
FIG. 4 shows a cross-sectional view of a semiconductor device structure, in accordance with some embodiments.

FIG. 4 shows a cross-sectional view of a semiconductor device structure 100c, in accordance with some embodiments. The semiconductor device structure 100c of FIG. 4 includes elements that are similar to, or the same as, elements of the semiconductor device structure 100a of FIG. 1Z, the difference between FIG. 4 and FIG. 1Z is that, no liner layer is between the substrate 102 and the dielectric layer 172.

Figure 5:
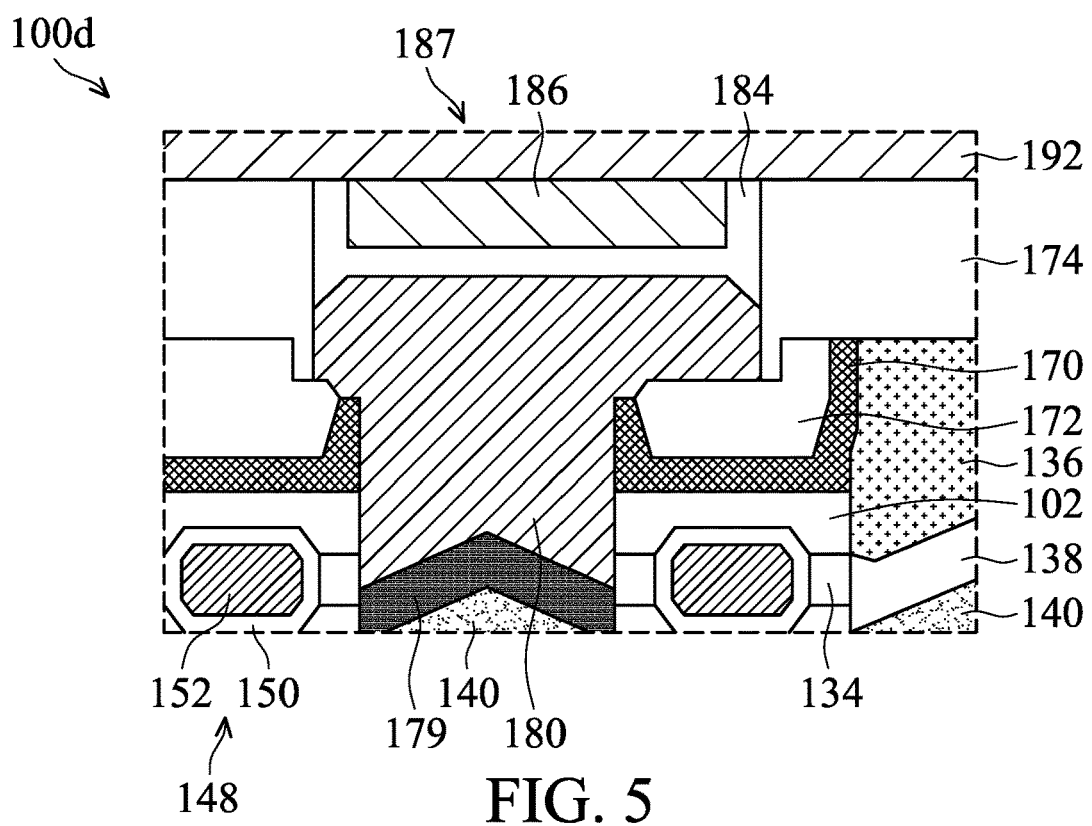
FIG. 5 shows a cross-sectional view of a semiconductor device structure, in accordance with some embodiments.

FIG. 5 shows a cross-sectional view of a semiconductor device structure 100d, in accordance with some embodiments. The semiconductor device structure 100d of FIG. 5 includes elements that are similar to, or the same as, elements of the semiconductor device structure 100a of FIG. 1Z, the difference between FIG. 5 and FIG. 1Z is that, no liner layer is between the first conductive material 180 and the gate structure 148.

Figure 6:
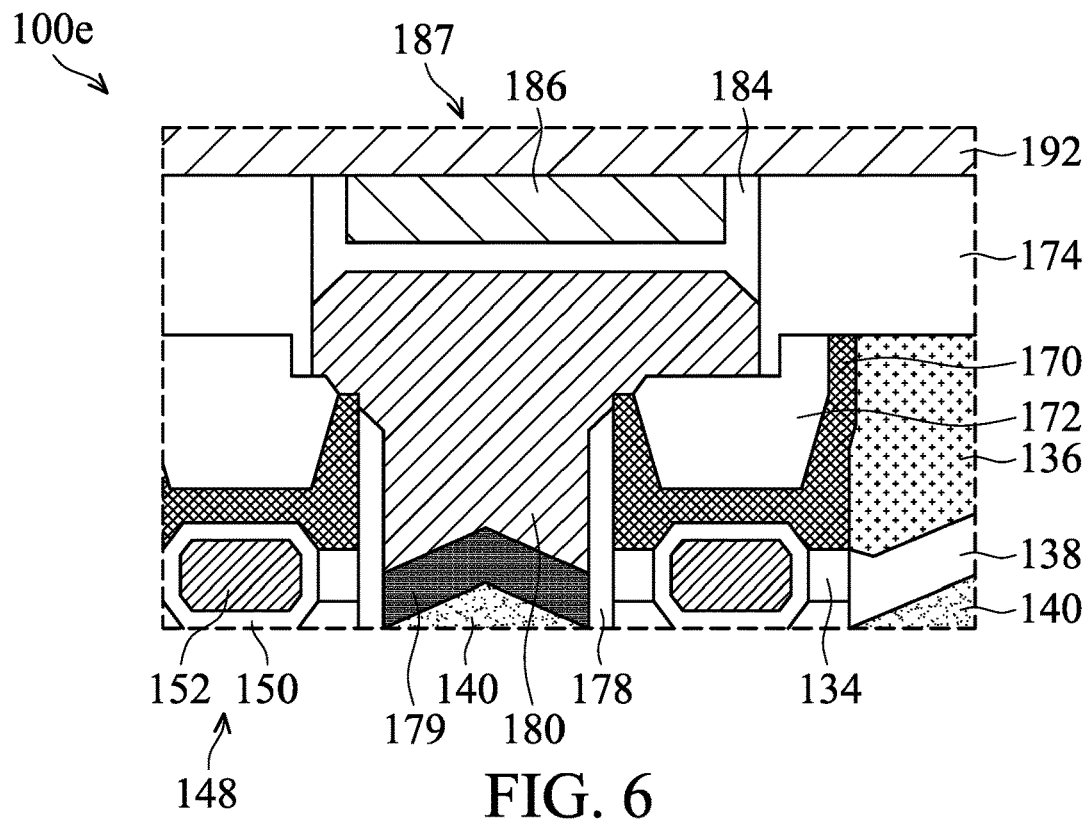
FIG. 6 shows a cross-sectional view of a semiconductor device structure, in accordance with some embodiments.

FIG. 6 shows a cross-sectional view of a semiconductor device structure 100e, in accordance with some embodiments. The semiconductor device structure 100e of FIG. 6 includes elements that are similar to, or the same as, elements of the semiconductor device structure 100a of FIG. 1Z, the difference between FIG. 6 and FIG. 1Z is that, there are no remaining substrates between the liner layer 170 and the gate structure 148. Therefore, the liner layer 170 is in direct contact with the gate structure 148. More specifically, the liner layer 170 is in direct contact with the gate dielectric layer 150 of the gate structure 148.

Figure 7:
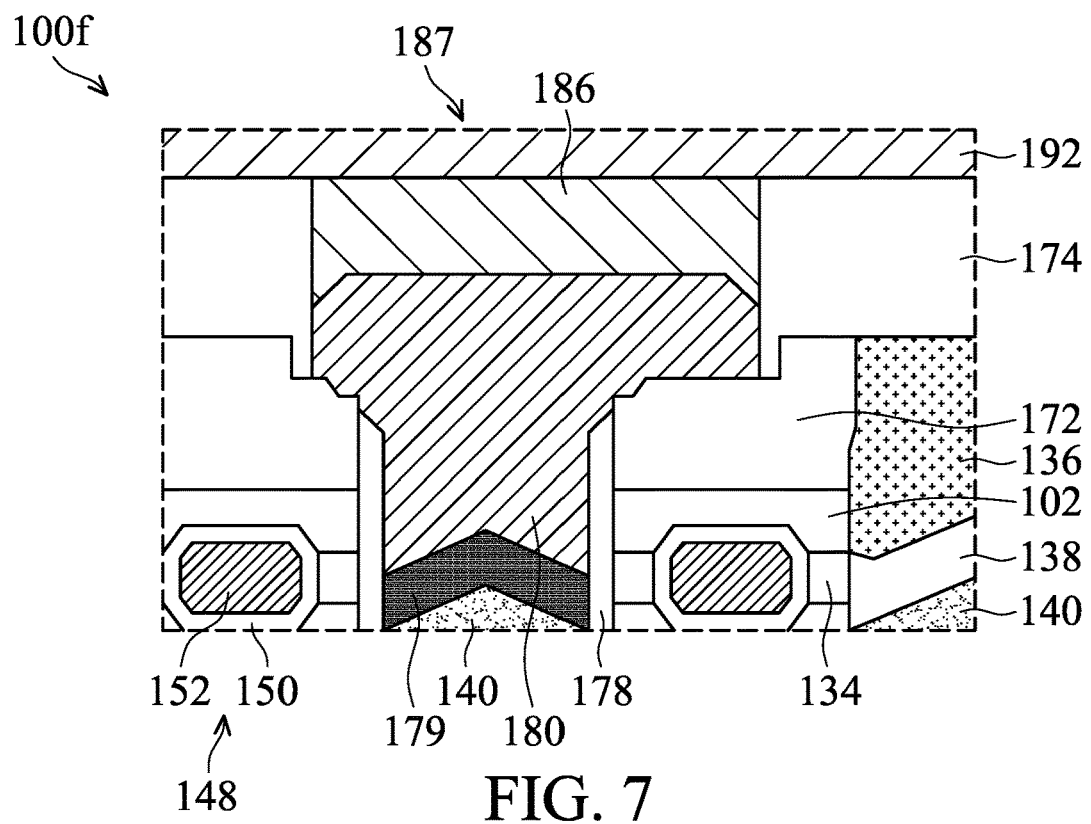
FIG. 7 shows a cross-sectional view of a semiconductor device structure, in accordance with some embodiments.

FIG. 7 shows a cross-sectional view of a semiconductor device structure 100f, in accordance with some embodiments. The semiconductor device structure 100f of FIG. 7 includes elements that are similar to, or the same as, elements of the semiconductor device structure 100a of FIG. 1Z, the difference between FIG. 7 and FIG. 1Z is that, no glue layer is between the substrate 102 and the dielectric layer 172, and no liner layer is between the substrate 102 and the dielectric layer 172.

Figure 8:
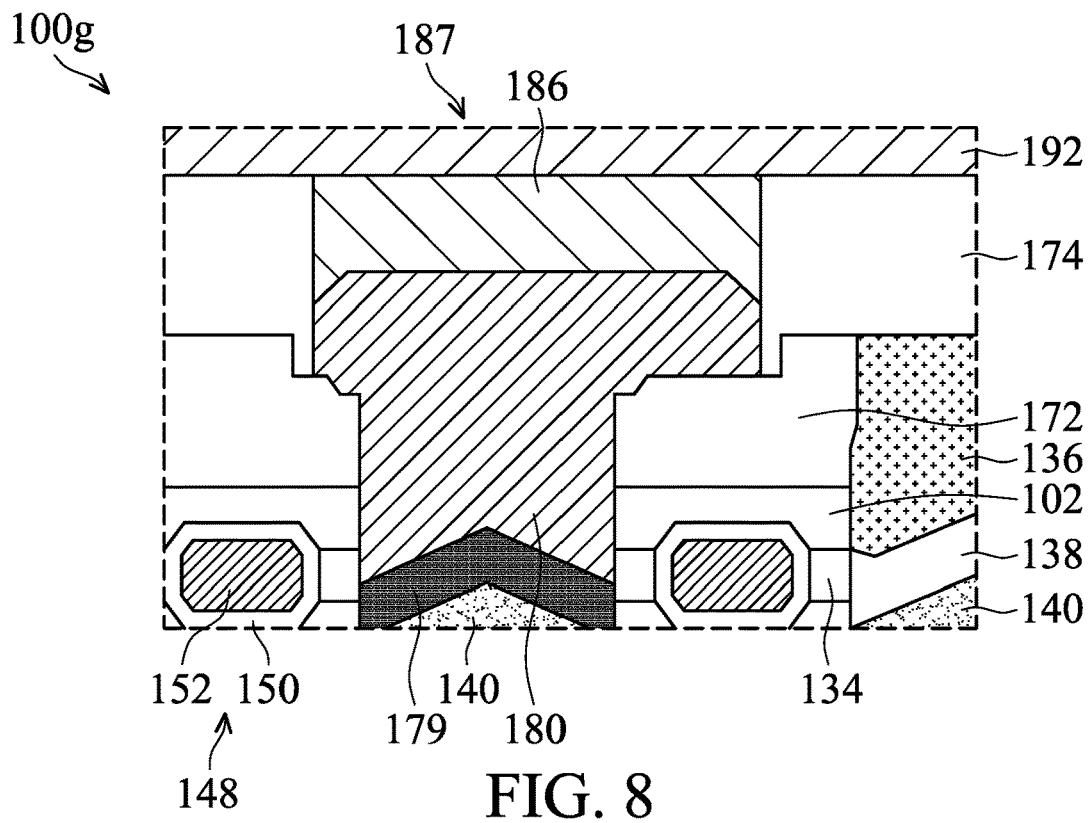
FIG. 8 shows a cross-sectional view of a semiconductor device structure, in accordance with some embodiments.

FIG. 8 shows a cross-sectional view of a semiconductor device structure 100g, in accordance with some embodiments. The semiconductor device structure 100g of FIG. 7 includes elements that are similar to, or the same as, elements of the semiconductor device structure 100a of FIG. 1Z, the difference between FIG. 8 and FIG. 1Z is that, no glue layer is between the substrate 102 and the dielectric layer 172, no liner layer is between the substrate 102 and the dielectric layer 172, and no liner layer is between the first conductive material 180 and the gate structure 148.

Figure 9:
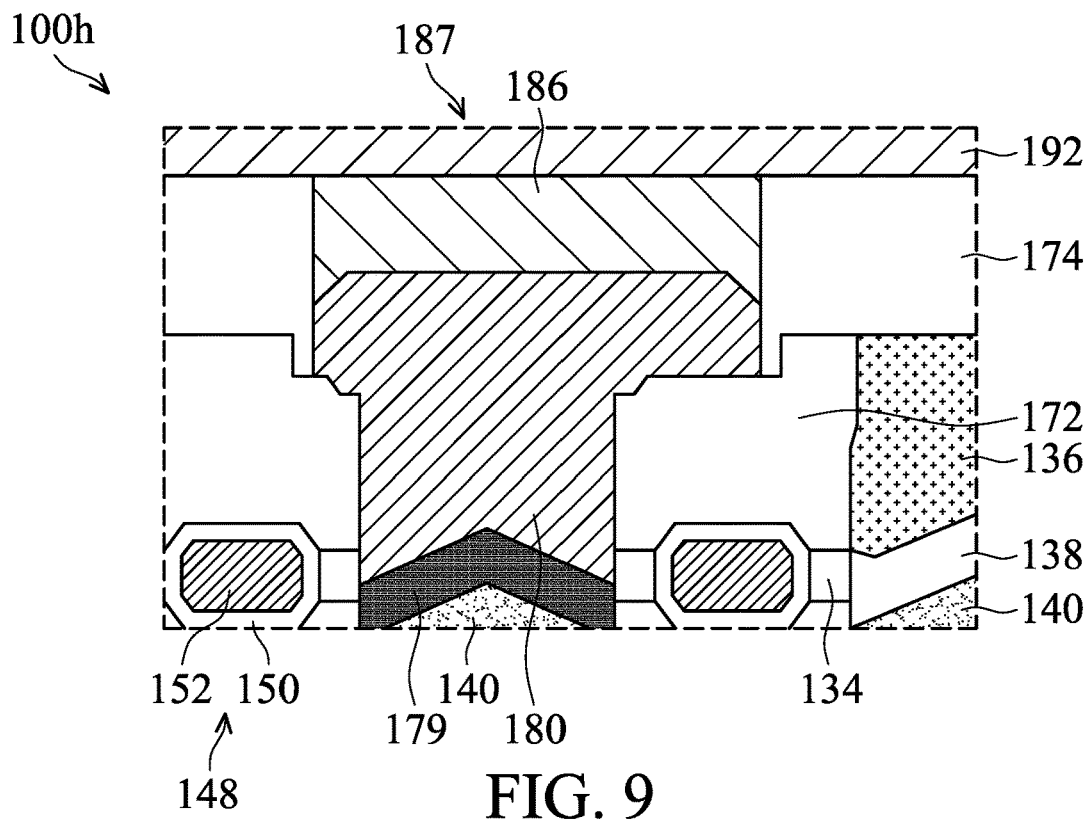
FIG. 9 shows a cross-sectional view of a semiconductor device structure, in accordance with some embodiments.

FIG. 9 shows a cross-sectional view of a semiconductor device structure 100h, in accordance with some embodiments. The semiconductor device structure 100h of FIG. 7 includes elements that are similar to, or the same as, elements of the semiconductor device structure 100a of FIG. 1Z, the difference between FIG. 9 and FIG. 1Z is that, no glue layer is between the substrate 102 and the dielectric layer 172, no liner layer is between the substrate 102 and the dielectric layer 172, no liner layer is between the first conductive material 180 and the gate structure 148, and there are no remaining substrates between the liner layer 170 and the gate structure 148.

In addition, it should be noted that same elements in FIGS. 1A to 1Z may be designated by the same numerals and may include materials that are the same or similar and may be formed by processes that are the same or similar; therefore such redundant details are omitted in the interests of brevity. In addition, although FIGS. 1A to 1Z are described in relation to the method, it will be appreciated that the structures disclosed in FIGS. 1A to 1Z are not limited to the method but may stand alone as structures independent of the method. Similarly, the methods shown in FIGS. 1A to 1Z are not limited to the disclosed structures but may stand alone independent of the structures. Furthermore, the nanostructures described above may include nanowires, nanosheets, or other applicable nanostructures in accordance with some embodiments.

Also, while the disclosed methods are illustrated and described below as a series of acts or events, it should be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure may include first nanostructures and second nanostructures and a gate structure wrapping around the first and second nanostructures. An S/D structure is between the first nanostructures and the second nanostructures. A front side S/D contact structure and a back side S/D contact structure are on opposite sides of the S/D structure. A conductive layer is formed on the back side S/D contact structure. The back side S/D contact structure includes a first conductive material and a second conductive material, and the first conductive material and the second conductive material are made of different materials. The second conductive material can block the diffusion of the first conductive material into the conductive layer. In addition, the voids in the back side S/D contact structure are reduced due to the process. Therefore, the reliability and the performance of the semiconductor structure are improved.

In some embodiments, a semiconductor structure is provided. The semiconductor structure includes first nanostructures surrounded by a first gate structure, and a first source/drain (S/D) structure adjacent to the first gate structure. The semiconductor structure includes a first contact structure formed over a first side of the first S/D structure, and a second contact structure formed over a second side of the first S/D structure. The second contact structure comprises a first portion and a second portion. The first portion and the second portion are made of different materials. The first S/D structure has a first width. The second portion has a second width. The first width is smaller than the second width.

In some embodiments, a semiconductor structure is provided. The semiconductor structure includes a first source/drain (S/D) structure between first nanostructures and second nanostructures and a first contact structure formed over a front side of the first S/D structure. The semiconductor structure includes a second contact structure formed over a back side of the first S/D structure. The second contact structure comprises a first portion and a second portion on the first portion. The first portion and the second portion are made of different materials. The first portion extends from a first position to a second position. The first position is between the first nanostructures and the second nanostructures. The second position is above the first nanostructures. The semiconductor structure further includes a conductive layer formed over the second contact structure. The conductive layer and the second portion are made of different materials.

In some embodiments, a method for manufacturing a semiconductor structure is provided. The method for manufacturing the semiconductor structure includes forming a first fin structure protruding from a front side of a substrate, and the first fin structure includes first semiconductor material layers and second semiconductor material layers alternately stacked. The method further includes forming an isolation structure surrounding the first fin structure, and forming an epitaxial sacrificial structure over the first fin structure. The method includes forming a first dielectric layer over the epitaxial structure, and forming an S/D structure over the first dielectric layer. The method further includes removing the epitaxial structure from a back side of the substrate to form a trench exposing the S/D structure, and forming a first conductive material in the trench. The method includes removing a portion of the first conductive material, and forming a second conductive material over the first conductive material, wherein the first conductive material and the second conductive material are made of different materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   first nanostructures surrounded by a first gate structure;
   a first source/drain (S/D) structure adjacent to the first gate structure;
   a first contact structure formed over a first side of the first S/D structure;
   a second contact structure formed over a second side of the first S/D structure, wherein the second contact structure comprises a first portion and a second portion, the first portion and the second portion are made of different materials, the first S/D structure has a first width, the second portion has a second width, and the first width is smaller than the second width; and
   a dielectric layer formed above the first gate structure, wherein the dielectric layer is in direct contact with the second contact structure.

2. The semiconductor structure as claimed in claim 1, wherein the second portion further comprises a glue layer.

3. The semiconductor structure as claimed in claim 1, further comprising:
   a liner layer between the dielectric layer and the first gate structure.

4. The semiconductor structure as claimed in claim 3, wherein the liner layer is in direct contact with the first gate structure.

5. The semiconductor structure as claimed in claim 1, further comprising:
   second nanostructures; and
   a second S/D structure adjacent to the second nanostructures, wherein the second contact structure is between the first nanostructures and the second nanostructures.

6. The semiconductor structure as claimed in claim 5, further comprising:
   a liner layer between the second contact structure and the first nanostructures.

7. The semiconductor structure as claimed in claim 1, further comprising:
   a conductive layer formed above the second contact structure, wherein the conductive layer and the second portion are made of different materials.

8. The semiconductor structure as claimed in claim 1, further comprising:
   an epitaxial structure formed adjacent to the first gate structure; and
   a dielectric layer below the epitaxial structure.

9. A semiconductor structure, comprising:
a first source/drain (S/D) structure between first nanostructures and second nanostructures;
a first contact structure formed over a front side of the first S/D structure;
a second contact structure formed over a back side of the first S/D structure, wherein the second contact structure comprises a first portion and a second portion on the first portion, the first portion and the second portion are made of different materials, the first portion extends from a first position to a second position, the first position is between the first nanostructures and the second nanostructures, and the second position is above the first nanostructures; and
a conductive layer formed over the second contact structure, wherein the conductive layer and the second portion are made of different materials.

10. The semiconductor structure as claimed in claim 9, further comprising:
a dielectric layer formed above a first gate structure, wherein the dielectric layer is in direct contact with the second contact structure.

11. The semiconductor structure as claimed in claim 10, further comprising:
a liner layer between the dielectric layer and a gate structure, wherein the liner layer is in direct contact with the gate structure.

12. The semiconductor structure as claimed in claim 9, further comprising:
a first gate structure formed adjacent to the first nanostructures;
an epitaxial sacrificial structure formed adjacent to the first gate structure;
a dielectric layer below the epitaxial sacrificial structure; and
a second S/D structure formed below the dielectric layer.

13. The semiconductor structure as claimed in claim 12, further comprising:
inner spacers formed between the first nanostructures, wherein the inner spacer is in direct contact with the dielectric layer.

14. The semiconductor structure as claimed in claim 9, wherein the first portion has a T-shaped structure.

15. The semiconductor structure as claimed in claim 9, further comprising:
a liner layer between the second contact structure and the first nanostructures.

16. A semiconductor device structure, comprising:
first nanostructures, wherein a bottommost first nanostructure have a first sidewall surface and a second sidewall surface;
a back side contact structure formed on the first sidewall surface of the bottommost first nanostructure;
an epitaxial structure formed on the second sidewall surface of the bottommost first nanostructure;
a liner layer on the bottommost first nanostructure, wherein the epitaxial structure is separated from the back side contact structure by the liner layer; and
a first dielectric layer on the liner layer, wherein a portion of the back side contact structure formed on the first dielectric layer.

17. The semiconductor device structure as claimed in claim 16, wherein the back side contact structure is higher than the epitaxial structure.

18. The semiconductor device structure as claimed in claim 16, wherein the back side contact structure has a first portion and a second portion, and a glue layer is between the first portion and the second portion.

19. The semiconductor device structure as claimed in claim 16, further comprising:
a second dielectric layer formed below the epitaxial structure; and
an S/D structure formed below the second dielectric layer.

20. The semiconductor device structure as claimed in claim 16, wherein the liner layer has a U-shaped structure.

* * * * *